US010629732B1

(12) United States Patent
Sills et al.

(10) Patent No.: US 10,629,732 B1
(45) Date of Patent: Apr. 21, 2020

(54) ELEVATIONALLY-EXTENDING TRANSISTORS, DEVICES COMPRISING ELEVATIONALLY-EXTENDING TRANSISTORS, AND METHODS OF FORMING A DEVICE COMPRISING ELEVATIONALLY-EXTENDING TRANSISTORS

(71) Applicant: Micron Technology, Inc., Boise, ID (US)

(72) Inventors: Scott E. Sills, Boise, ID (US); Kirk D. Prall, Boise, ID (US); Durai Vishak Nirmal Ramaswamy, Boise, ID (US); Ramanathan Gandhi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/154,924

(22) Filed: Oct. 9, 2018

(51) Int. Cl.
*H01L 29/78* (2006.01)
*H01L 29/51* (2006.01)
(Continued)

(52) U.S. Cl.
CPC .. *H01L 29/78391* (2014.09); *H01L 27/11514* (2013.01); *H01L 27/11597* (2013.01); *H01L 29/0649* (2013.01); *H01L 29/0847* (2013.01); *H01L 29/1033* (2013.01); *H01L 29/516* (2013.01)

(58) Field of Classification Search
CPC ......... H01L 27/11514; H01L 27/11597; H01L 29/0649; H01L 29/0847; H01L 29/1033; H01L 29/516; H01L 29/78391
See application file for complete search history.

(56) References Cited

U.S. PATENT DOCUMENTS 9,177,872 B2    11/2015  Sandhu
9,673,054 B2 *   6/2017  Mariani ............. H01L 27/1027
(Continued)

OTHER PUBLICATIONS

Park et al., "Overview of electroceramic materials for oxide semiconductor thin film transistors", Journal of Electroceramics, Sep. 24, 2013, Netherlands, pp. 117-140.

*Primary Examiner* — Allan R Wilson
(74) *Attorney, Agent, or Firm* — Wells St. John P.S.

(57) ABSTRACT

A device comprises an array comprising rows and columns of elevationally-extending transistors. An access line interconnects multiple of the elevationally-extending transistors along individual of the rows. The transistors individually comprise an upper source/drain region, a lower source/drain region, and a channel region extending elevationally therebetween. The channel region comprises an oxide semiconductor. A transistor gate is operatively laterally-proximate the channel region and comprises a portion of an individual of the access lines. Intra-row-insulating material is longitudinally between immediately-intra-row-adjacent of the elevationally-extending transistors. Inter-row-insulating material is laterally between immediately-adjacent of the rows of the elevationally-extending transistors. At least one of the intra-row-insulating material and the inter-row-insulating material comprises void space. Other embodiments, including method embodiments, are disclosed.

15 Claims, 19 Drawing Sheets

(51) Int. Cl.
  *H01L 29/06* (2006.01)
  *H01L 27/11597* (2017.01)
  *H01L 29/10* (2006.01)
  *H01L 27/11514* (2017.01)
  *H01L 29/08* (2006.01)

(56) References Cited

U.S. PATENT DOCUMENTS

2012/0205713 A1* 8/2012 Tang ................... H01L 27/1027
                                                    257/133
2014/0106554 A1* 4/2014 Pozzi ................ H01L 21/28088
                                                    438/589
2019/0067303 A1* 2/2019 Juengling ........... H01L 27/1159

* cited by examiner

ELEVATIONALLY-EXTENDING TRANSISTORS, DEVICES COMPRISING ELEVATIONALLY-EXTENDING TRANSISTORS, AND METHODS OF FORMING A DEVICE COMPRISING ELEVATIONALLY-EXTENDING TRANSISTORS

TECHNICAL FIELD

Embodiments disclosed herein pertain to elevationally-extending transistors, to devices comprising elevationally-extending transistors, and to methods of forming devices comprising elevationally-extending transistors.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as word lines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulating material, that stored field will be volatile or non-volatile. For example, a capacitor insulating material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages, and remains after removal of the programming voltage (at least for a time). Each polarization state has a different charge-stored capacitance from the other, and which ideally can be used to write (i.e., store) and to read (i.e., determine) a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor.

A field effect transistor is another type of electronic component that may be used in a memory cell. These transistors comprise a pair of source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Field effect transistors may be ferroelectric wherein at least some portion of the gate construction (e.g., the gate insulator) comprises ferroelectric material. The two different polarized states of the ferroelectric material in transistors may be characterized by different threshold voltage ($V_t$) for the transistor or by different channel conductivity for a selected operating voltage.

Both of one or more capacitors and one or more transistors may be in an individual memory cell. Alternately, by way of example, an individual memory cell may have only one or more transistors. Further, a plurality of transistors may be formed in an array other than memory circuitry.

DETAILED DESCRIPTION OF EXAMPLE EMBODIMENTS

Figure 1:
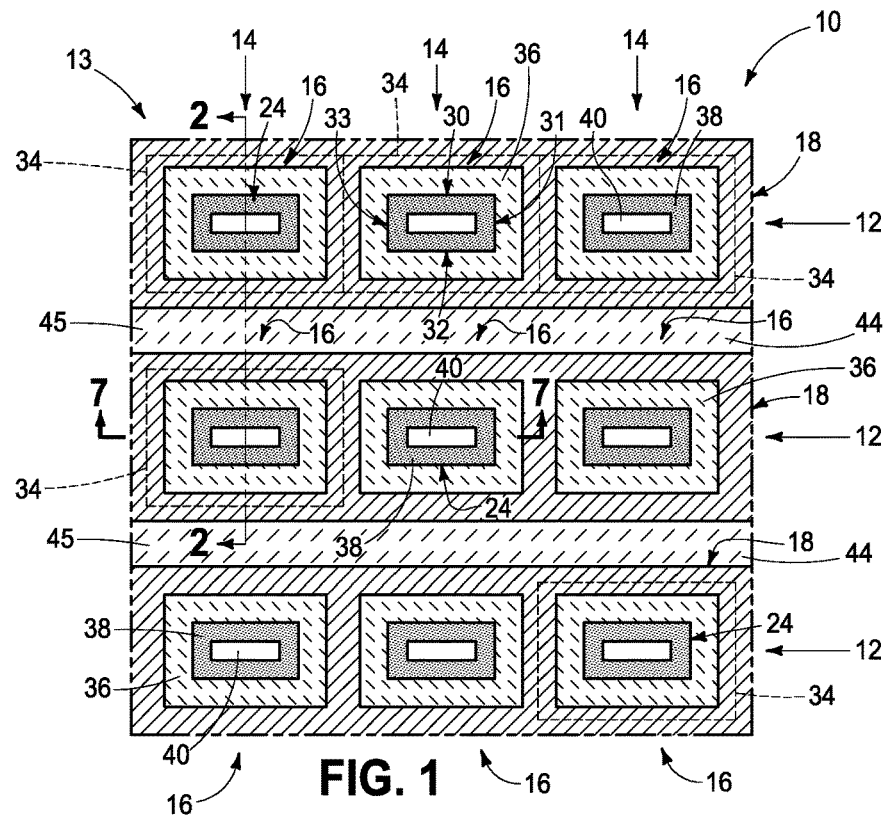
FIG. 1 is a diagrammatic cross-sectional view of a portion of a device comprising an array in accordance with an embodiment of the invention, and includes a portion taken through line 1-1 in FIGS. 2 and 7.
Figure 2:
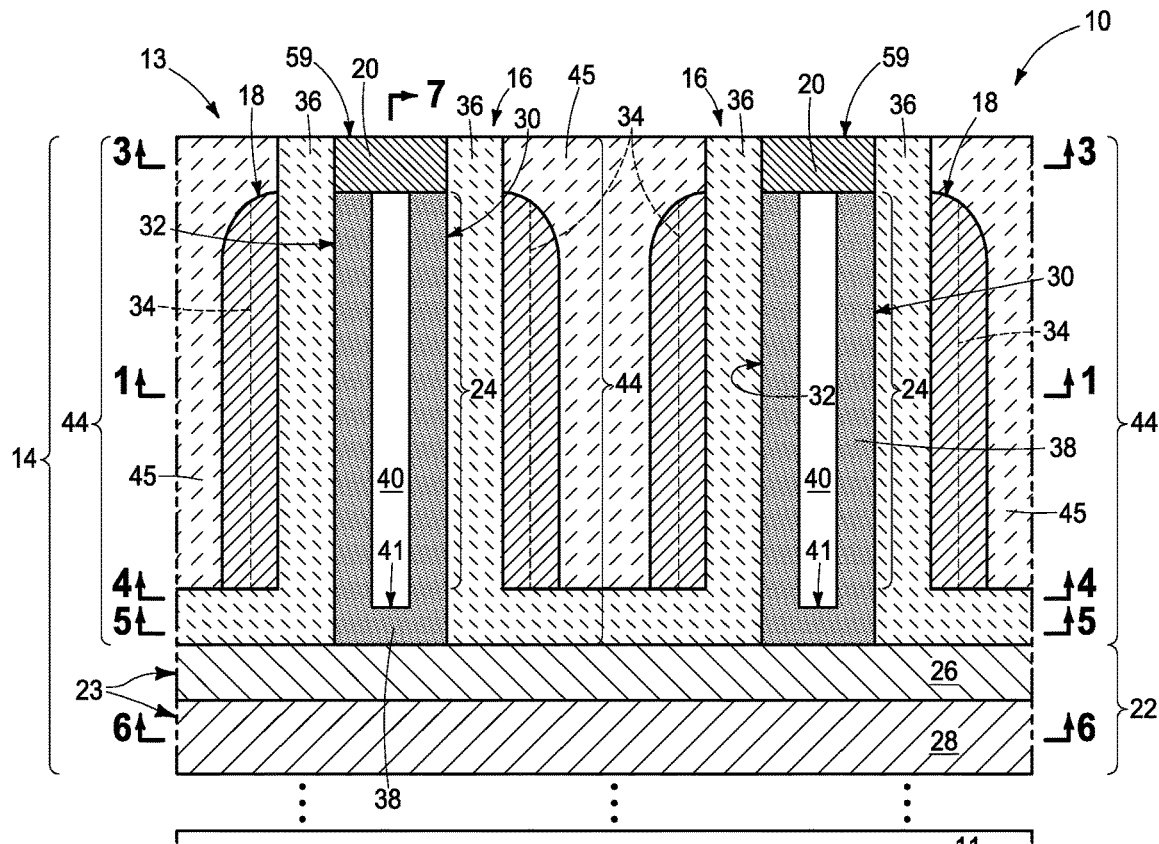
FIG. 2 is an enlarged cross-sectional view taken through line 2-2 in FIGS. 1 and 3-6.
Figure 3:
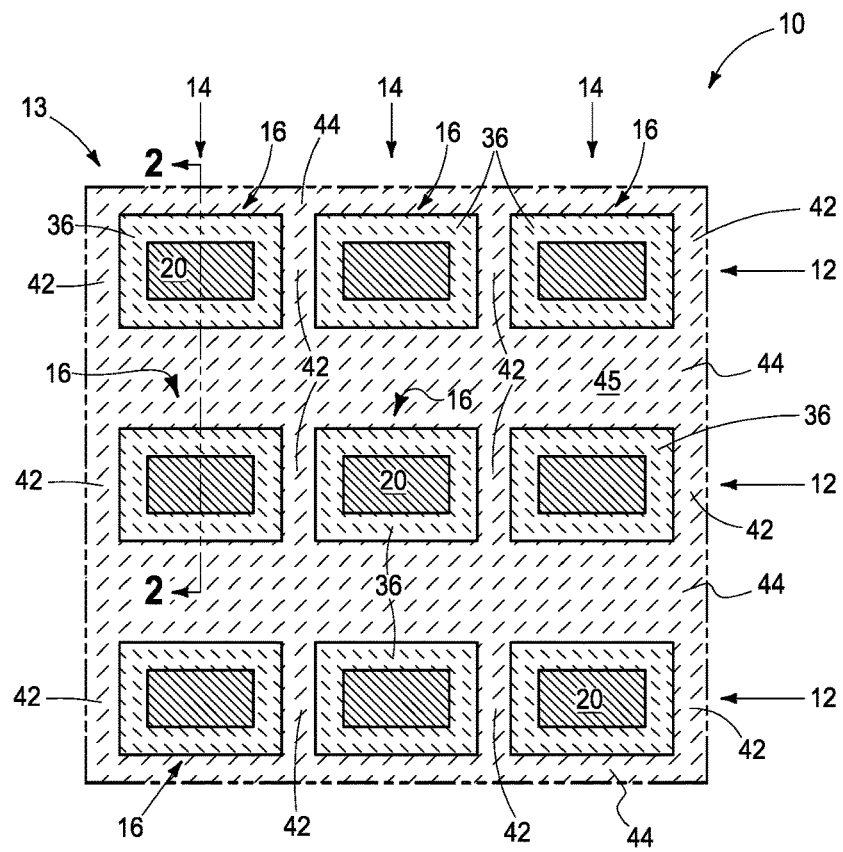
FIG. 3 is a cross-sectional view including a portion taken through line 3-3 in FIGS. 2 and 7.
Figure 4:
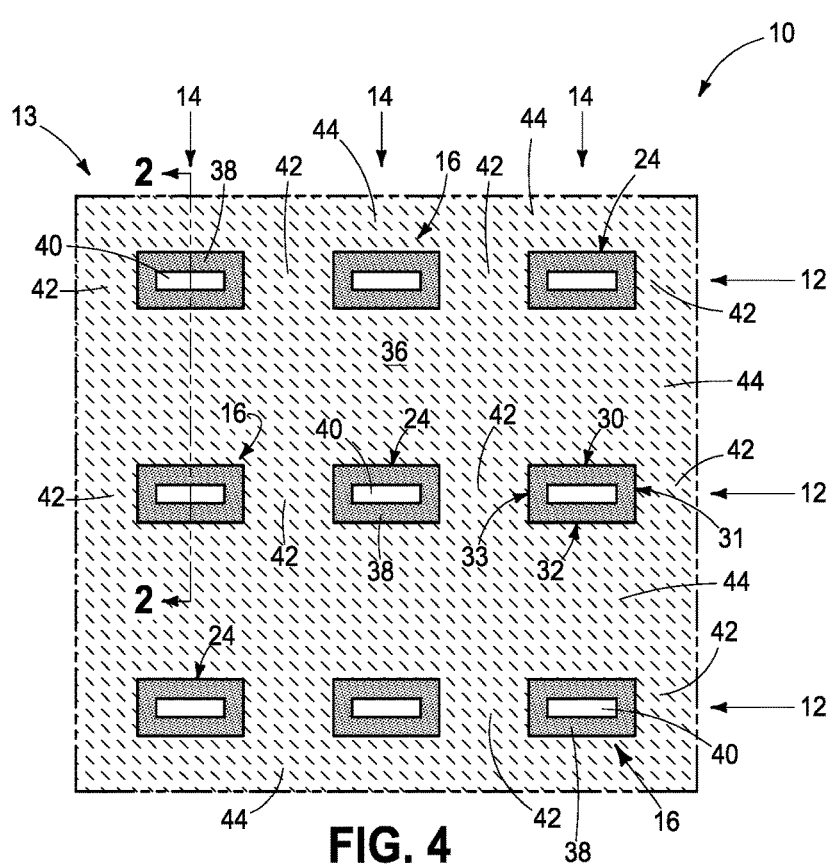
FIG. 4 is a cross-sectional view including a portion taken through line 4-4 in FIGS. 2 and 7.
Figure 5:
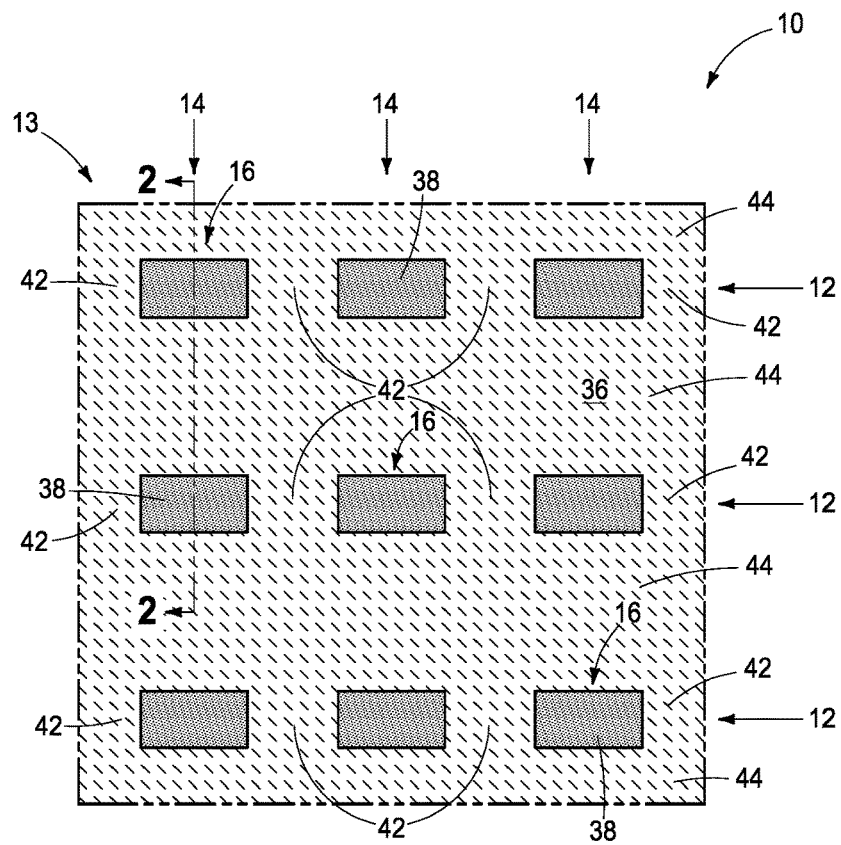
FIG. 5 is a cross-sectional view including a portion taken through line 5-5 in FIGS. 2 and 7.
Figure 6:
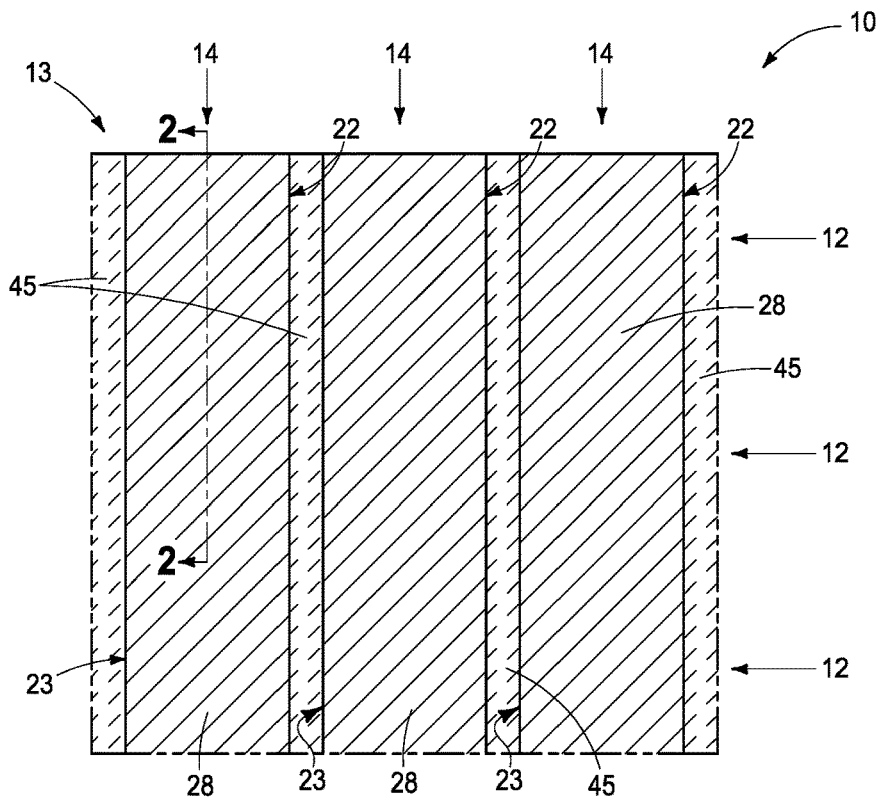
FIG. 6 is a cross-sectional view including a portion taken through line 6-6 in FIGS. 2 and 7.
Figure 7:
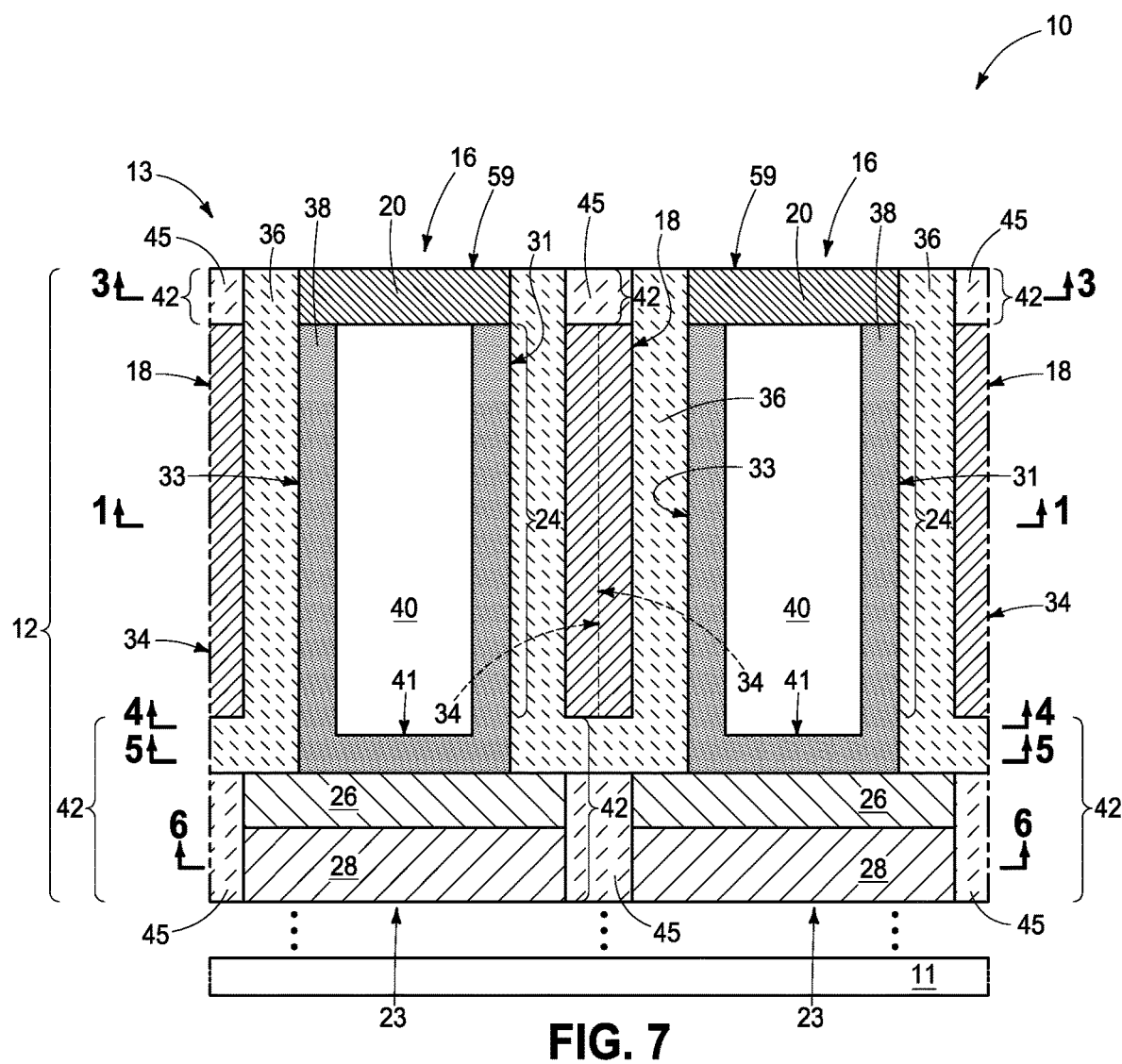
FIG. 7 is a cross-sectional view taken through line 7-7 in FIGS. 1 and 2.

Embodiments of the invention encompass elevationally-extending transistors, devices comprising elevationally-extending transistors, and methods of forming a device comprising elevationally-extending transistors. First embodiments are initially described with reference to FIGS. 1-7. A substrate fragment, construction, or device 10 comprises a base substrate 11 that may include any one or more of conductive/conductor/conducting (i.e., electrically herein), semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-7-depicted materials. For example, other partially or wholly fabricated components of integrated circuitry may be provided somewhere above, about, or within base substrate 11. Control and/or other peripheral circuitry for operating components within an array of transistors may also be fabricated, and may or may not be wholly or partially within a transistor array or sub-array. Further, multiple sub-arrays may also be fabricated and operated independently, in tandem, or otherwise relative one another. As used in this document, a "sub-array" may also be considered as an array.

Device 10 comprises an array 13 comprising rows 12 and columns 14 of elevationally-extending transistors 16. Portions of only nine transistors 16 are collectively visible in FIGS. 1-7, with an array likely having thousands, hundreds of thousands, millions, etc. of transistors 16. Example elevationally-extending transistors 16 are shown as being arrayed in a 2D rectangular Bravais lattice, although any other existing or yet-do-be-developed arrangement may be used (e.g., a non-Bravais lattice or another 2D Bravais lattice such as oblique, centered rectangular, square, or hexagonal). An access line 18 interconnects multiple elevationally-extending transistor 16 along individual rows 12. Access lines 18 may comprise any suitable conductive material (e.g., metal material and/or conductively-doped semiconductive material). Embodiments of the invention encompass devices comprising an array, access lines, and elevationally-extending transistors, and as well elevationally-extending transistors independent of being fabricated relative to or within an array and independent of comprising an access line. Individual transistors 16 comprises an upper source/drain region 20, a lower source/drain region 22, and a channel region 24 extending elevationally there-between. Upper source/drain region 20 may be considered as comprising a top 59. The source/drain regions may comprise any suitable conductive material (e.g., metal material and/or conductively-doped semiconductive material) and/or semiconductive material. In one embodiment and as shown, lower source/drain region 22 comprises a longitudinally elongated source line 23 extending along and interconnecting multiple elevationally-extending transistors 16 along individual columns 14. Insulator material 45 (e.g., silicon dioxide and/or silicon nitride) is between source lines 23. Example source/drain lines 23 are shown as comprising an upper material 26 (e.g., elemental ruthenium) and a lower material 28 (e.g., conductively-doped silicon). Example channel regions 24 individually comprise sides 30, 31, 32, and 33 (i.e., in a straight-line vertical cross-section) with, for example, sides 30, 32 comprising two opposing sides of channel region 24 and sides 31, 33 comprising two opposing sides of channel region 24. Channel region 24 is shown as being rectangular in horizontal cross-section although other shapes may of course be used (e.g., any polygon, a structure have curved sides [e.g., a circle, ellipse, etc.], a combination of curved and straight sides, etc.).

A transistor gate 34 is over two opposing sides (30, 32 and/or 31, 33) of channel region 24. In one embodiment, transistor gate 34 laterally surrounds channel region 24 and in one embodiment comprises a portion of an individual access line 18. A gate insulator material 36 (e.g., silicon dioxide, silicon nitride, hafnium oxide, barium strontium titanate, other high-k dielectrics, etc.) is over individual of the two opposing sides of channel region 24 laterally between channel region 24 and transistor gate 34.

The two opposing sides of channel region 24 individually comprise an oxide semiconductor 38 (ideally amorphous). Example such materials include $ZnO_x$, $InO_x$, $In_2O_3$, $SnO_2$, $TiO_x$, $Zn_xO_yN_z$, $Mg_xZn_yO_z$, $In_xZn_yO_z$, $In_xGa_yZn_zO_a$, $In_xGa_ySi_zO_a$, $Zr_xIn_yZn_zO_a$, $Hf_xIn_yZn_zO_a$, $Sn_xIn_yZn_zO_a$, $Al_xSn_yIn_zZn_aO_d$, $Si_xIn_yZn_zO_a$, $Zn_xSn_yO_z$, $Al_xZn_ySn_zO_a$, $Ga_xZn_yS_nO_a$, and $Zr_xZn_ySn_zO_a$. In one embodiment and as shown, all sides 30-33 of channel region 24 individually comprise an oxide semiconductor. The material designated with numeral 38 may comprise, consist essentially of, or consist of an oxide semiconductor. For example, such may comprise multiple different composition materials and/or regions, including for example different combinations of different composition oxide semiconductor materials (whether crystalline or amorphous) and/or combinations of oxide semiconductor materials with materials that are not oxide semiconductor materials. Further, such other materials may not necessarily operably function as a channel of channel region 24 as long as channel region 24 overall is capable of functioning as a switchable channel determined by electric field applied thereto by gate 34. Regardless, an elevationally elongated void space 40 is laterally between the two opposing sides of channel region 24 that comprises an oxide semiconductor. Void space 40 may be considered as comprising a bottom 41, and in one embodiment void space 40 is completely surrounded by oxide semiconductor of material 38 (i.e., in at least one straight-line horizontal cross-section; e.g., a horizontal cross-section shown by either of FIGS. 1 and 4).

In one embodiment and as shown, oxide semiconductor of material 38 extends laterally across bottom 41 of void space 40. In one embodiment, oxide semiconductor of material 38 is at least partially below gate 34. In one such embodiment, oxide semiconductor of material 38 is everywhere below gate 34, and in one such embodiment is nowhere directly below gate 34. In one embodiment, void space 40 is directly against oxide semiconductor of material 38. In one embodiment, the oxide semiconductor extends laterally across all of bottom 41 of void space 40 and longitudinally along all of bottom 41 of void space 40.

In one embodiment, transistor 16 is one transistor of an array 13 of a plurality of transistors 16 of like-construction relative one another. Intra-row-insulating material 42 is longitudinally between immediately-intra-row-adjacent elevationally-extending transistor 16. Inter-row-insulating material 44 is laterally between immediately-adjacent rows 12 of elevationally-extending transistors 16. Materials 42 and 44 may be of the same or different composition(s) relative one another, with same composition being shown (e.g., each being a combination of insulator materials 45 and 36).

Elevationally-extending transistors 16 and device 10 may be manufactured using any suitable existing or yet-to-be-developed technique(s). Further, transistors 16 may be associated with or inherently comprise a data-storage device of existing or yet-to-be-developed circuitry, for example as part of memory circuitry. As examples, transistors 16 may individually comprise a reversibly programmable charge-storage region (not shown) between the gate insulator 36 and conductive gate 34. Alternately or additionally, and by way of example only, gate insulator 36 may be ferroelectric. Further, and regardless, a capacitor (not shown) may be directly electrically coupled to source/drain region 20, with an individual transistor and such capacitor forming a single memory cell. The capacitor insulator of the capacitor may be ferroelectric.

Any other attribute(s) or aspect(s) as shown and/or described herein with respect to other embodiments may be used in the embodiments described above with reference to FIGS. 1-7.

Another example device 10a in accordance with an embodiment of the invention is next described with reference to FIGS. 8-14. Like numerals from the above-described embodiments have been used where appropriate, with some construction differences being indicated with the suffix "a" or with different numerals. Device 10a comprises an array 13a comprising rows 12 and columns 14 of elevationally-extending transistors 16a. An access line 18a interconnects multiple elevationally-extending transistors 16a along individual rows 12. Transistors 16a individually comprise an upper source/drain region 20, a lower source/drain region 22, and a channel region 24a extending elevationally therebetween. Channel region 24a comprises an oxide semiconductor 38a. The example embodiments of FIGS. 8-14 are shown as not comprising a void space 40 unlike that of the first-described embodiments, although alternately the embodiments of FIGS. 8-14 may have a void space 40 (not shown).

A transistor gate 34a is operatively laterally-proximate channel region 24a (e.g., gate insulator 36 being between gate 34a and channel 24a), and comprises a portion of an individual access line 18a. In one embodiment, transistor gate 34a is over two opposing sides of channel region 24a (e.g., only over two opposing sides 30, 32). Alternately by way of examples, the transistor gate may completely laterally surround (not shown) the channel region or may be over only one side (not shown) of channel region 24a.

Intra-row-insulating material 42a is longitudinally between immediately-intra-row-adjacent elevationally-extending transistor 16a. Inter-row-insulating material 44a is laterally between immediately-adjacent of rows 12 of elevationally-extending transistor 16a. At least one of intra-row-insulating material 42a and inter-row-insulating material 44a comprises void space. In one embodiment and as shown, intra-row-insulating material 42 comprises intra-row void space 46 and inter-row-insulating material 44 comprises inter-row void space 48, and in one such embodiment with void spaces 46 and 48 not collectively completely surrounding channel region 24a of individual transistor 16a (e.g., due to intervening material of access line 18. Alternately, only one (not shown) of intra-row-insulating material 42a or inter-row-insulating material 44a may comprise void space. The depicted laterally-spaced longitudinal portions of access lines 18a in individual rows 12 may be directly coupled with one another outside of array 13, for example as shown by respective schematic interconnect lines 19.

In some embodiments, immediately-intra-row-adjacent transistor 16a may be considered as having a respective maximum intra-row-separation-distance 50 longitudinally between closest-operative-transistor material (e.g., any of materials 20, 38a, 22, 26, and/or 28). Such maximum distance 50 may be the same for all row-adjacent transistors 16a in a row 12, or at least some such maximum separation distances may be different (not show). Regardless, in one embodiment where intra-row-insulating material 42a comprises intra-row void space 46, such intra-row void space individually extends along at least 50%, and in one such embodiment along at least 75% (100% being shown), of the respective maximum intra-row-separation-distance 50.

Any other attribute(s) or aspect(s) as shown and/or described herein with respect to other embodiments may be used.

An embodiment of the invention comprises a method of forming a device, for example, a device comprising array 13a. An example such method is described with reference to FIGS. 15-25 to result in an example finished construction of FIGS. 8-14. Like numerals from the above-described embodiments have been used for predecessor construction(s), regions, and like/predecessor materials thereof. Such a method includes forming an array comprising rows and columns of elevationally-extending transistors, and including an access line interconnecting multiple of the elevationally-extending transistors along individual of the rows. For example, and referring to FIGS. 15-18, construction 10a is initially formed to comprise oxide-semiconductor-channel-comprising material 38a, gate insulator material 36, access lines 18a, lower source/drain lines 23, and upper source/drain region material 20 running continuously in lines along individual rows 12.

Referring to FIGS. 19-22, materials 38*a*, 36, and 20 have been patterned (intra-row) to essentially complete fabrication of individual transistors 16*a*. Thereby, intra-row void space 46 is longitudinally between immediately-intra-row-adjacent elevationally-extending transistors 16*a*. Additionally, inter-row void space 48 is laterally between immediately-adjacent rows 12 of elevationally-extending transistors 16*a*.

Figure 8:
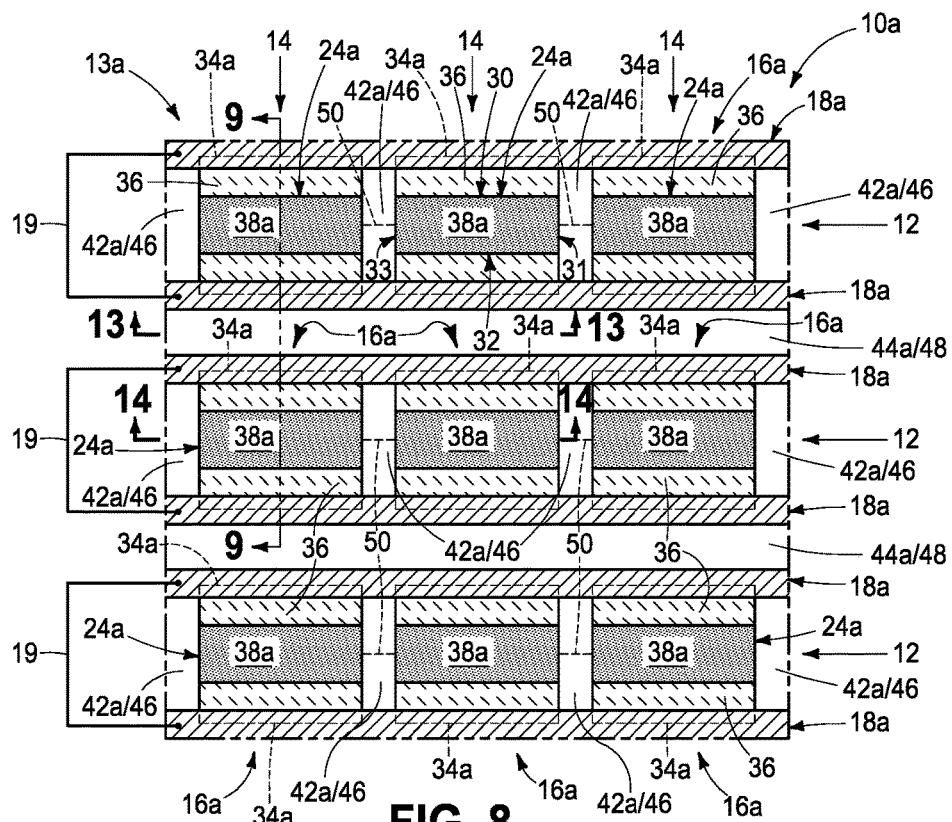
FIG. 8 is a diagrammatic hybrid schematic and cross-sectional view of a portion of a device comprising an array in accordance with an embodiment of the invention, and includes a portion taken through line 8-8 in FIGS. 9 and 14.
Figure 9:
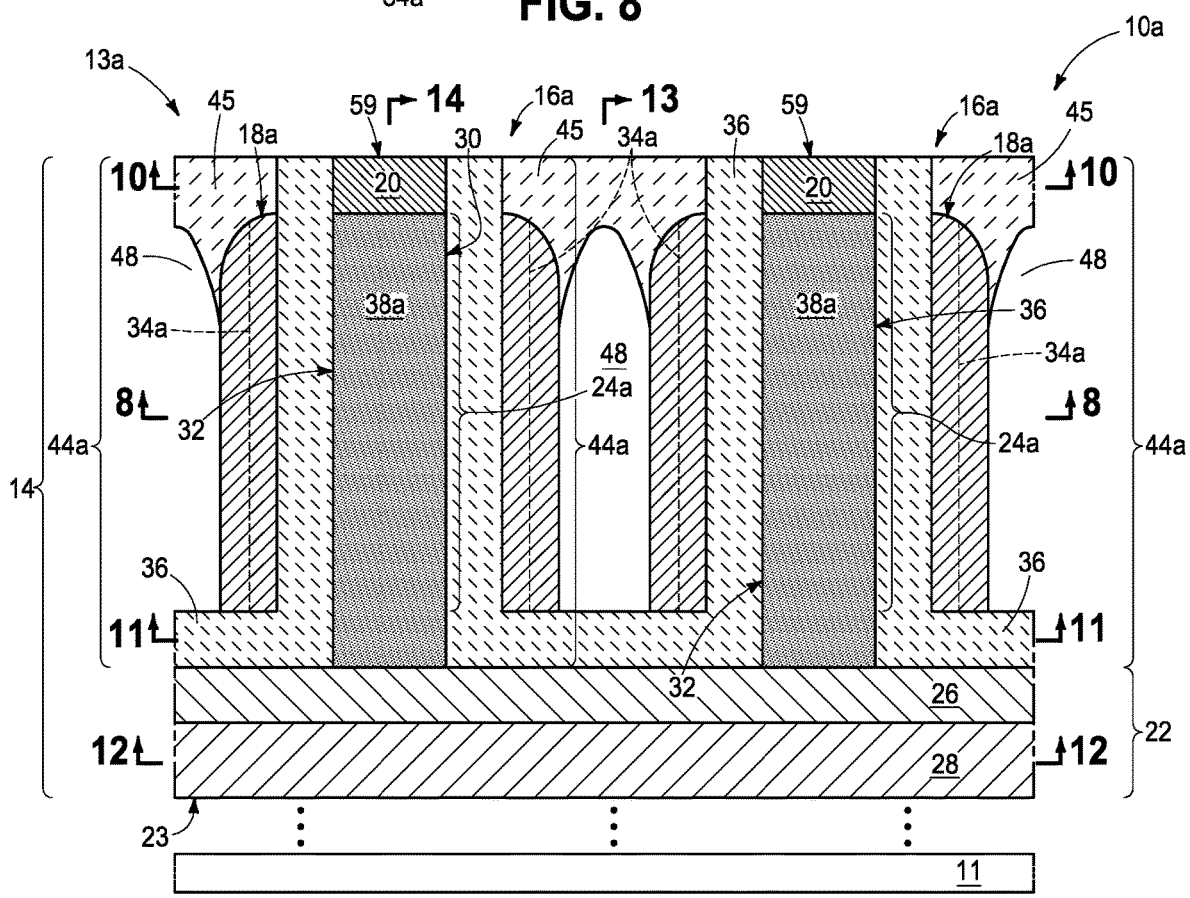
FIG. 9 is an enlarged cross-sectional view taken through line 9-9 in FIGS. 8 and 10-12.
Figure 10:
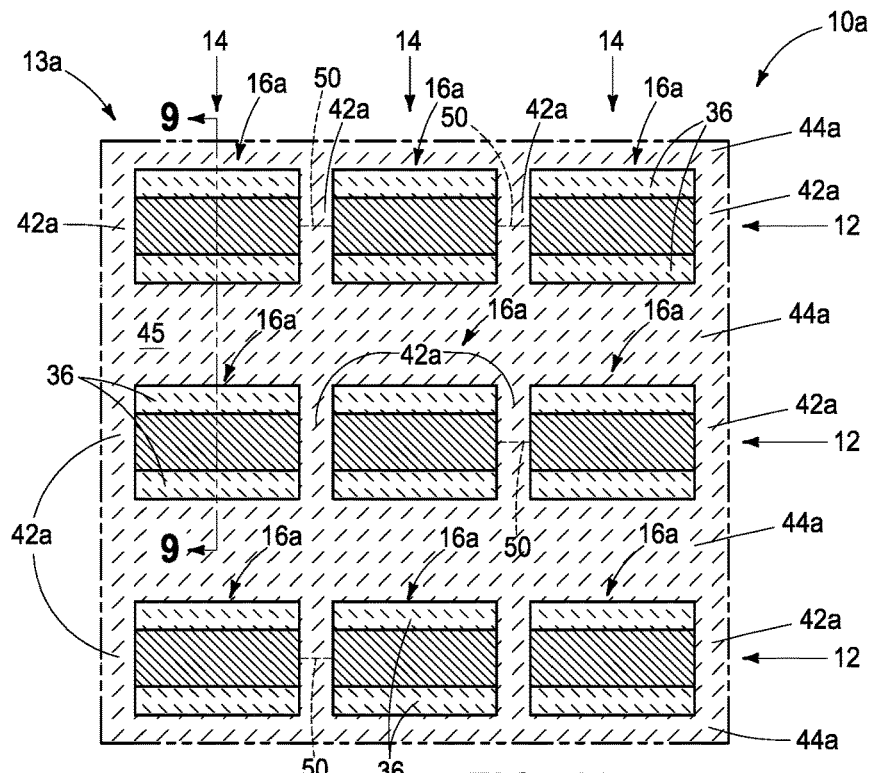
FIG. 10 is a cross-sectional view including a portion taken through line 10-10 in FIGS. 9, 13, and 14.
Figure 11:
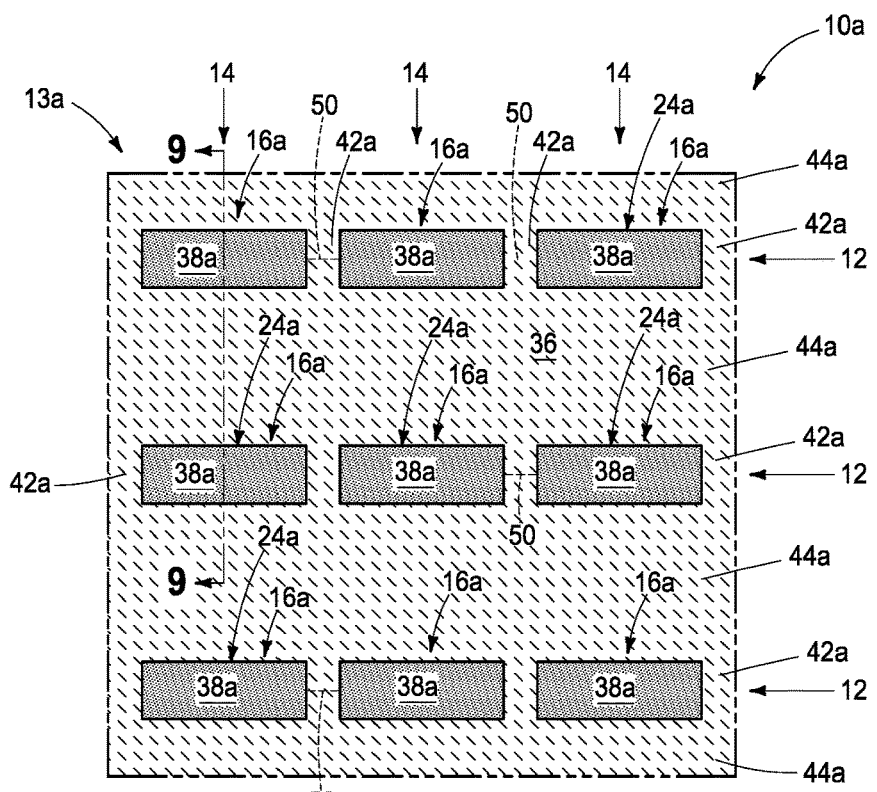
FIG. 11 is a cross-sectional view including a portion taken through line 11-11 in FIGS. 9, 13, and 14.
Figure 12:
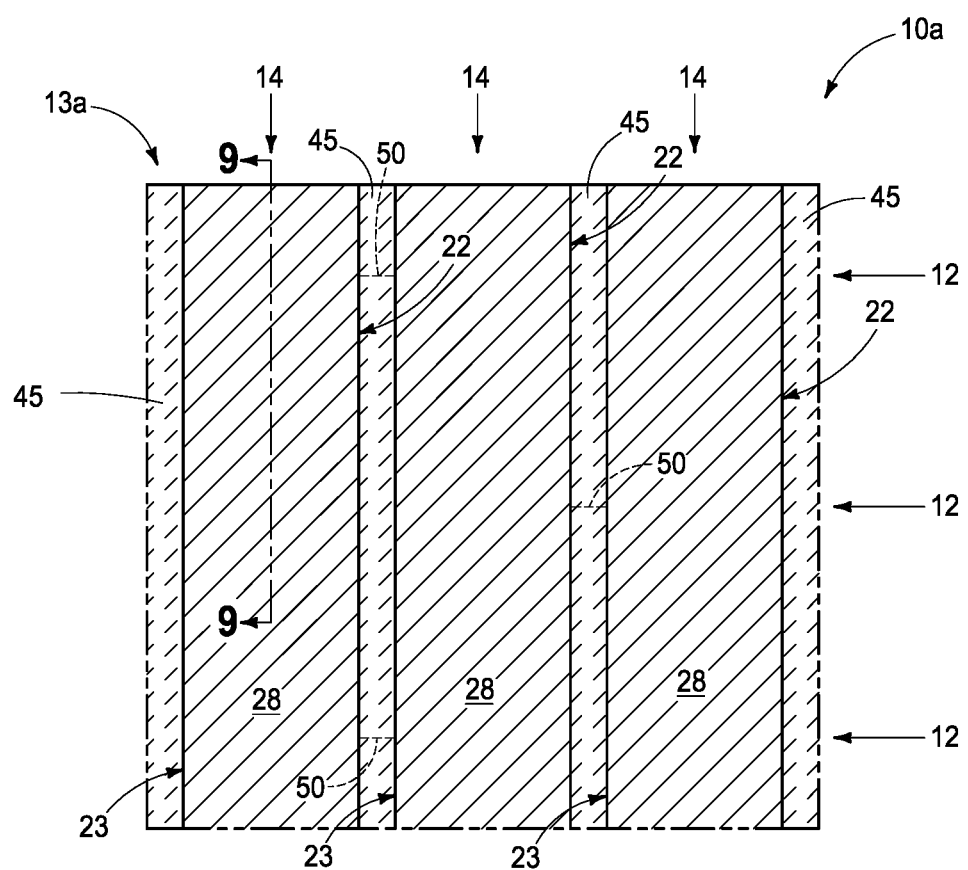
FIG. 12 is a cross-sectional view including a portion taken through line 12-12 in FIGS. 9, 13, and 14.
Figure 13:
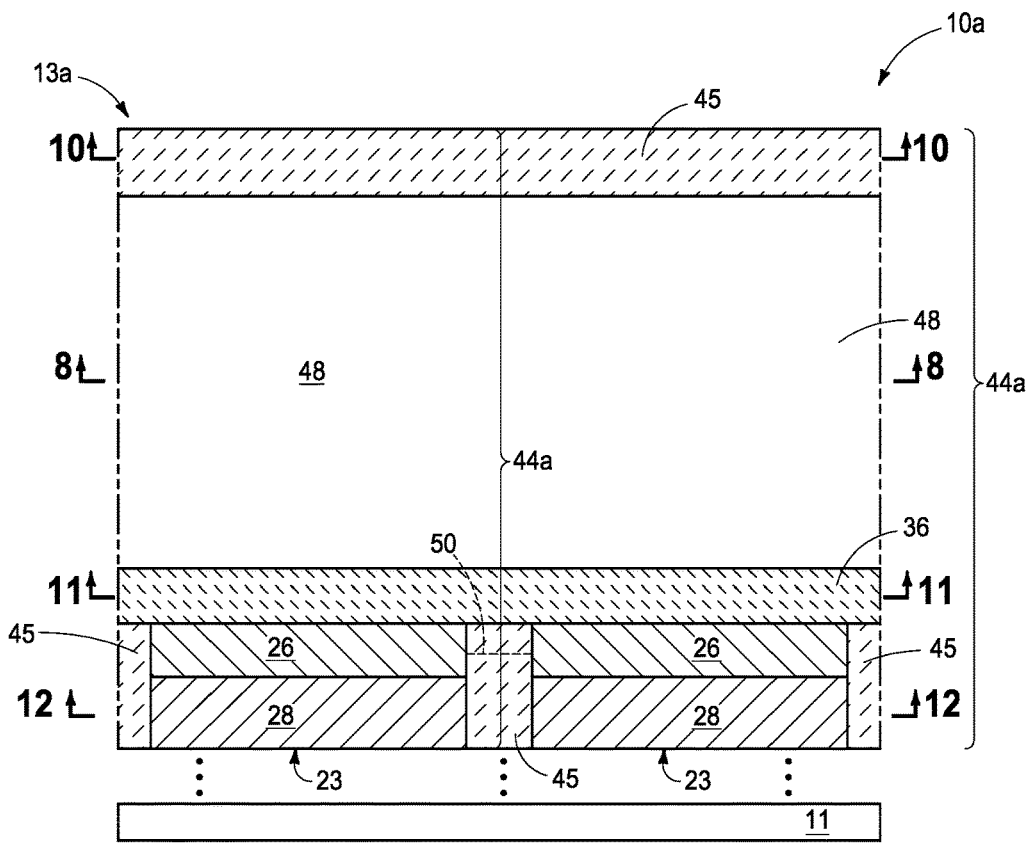
FIG. 13 is a cross-sectional view taken through line 13-13 in FIG. 9.
Figure 14:
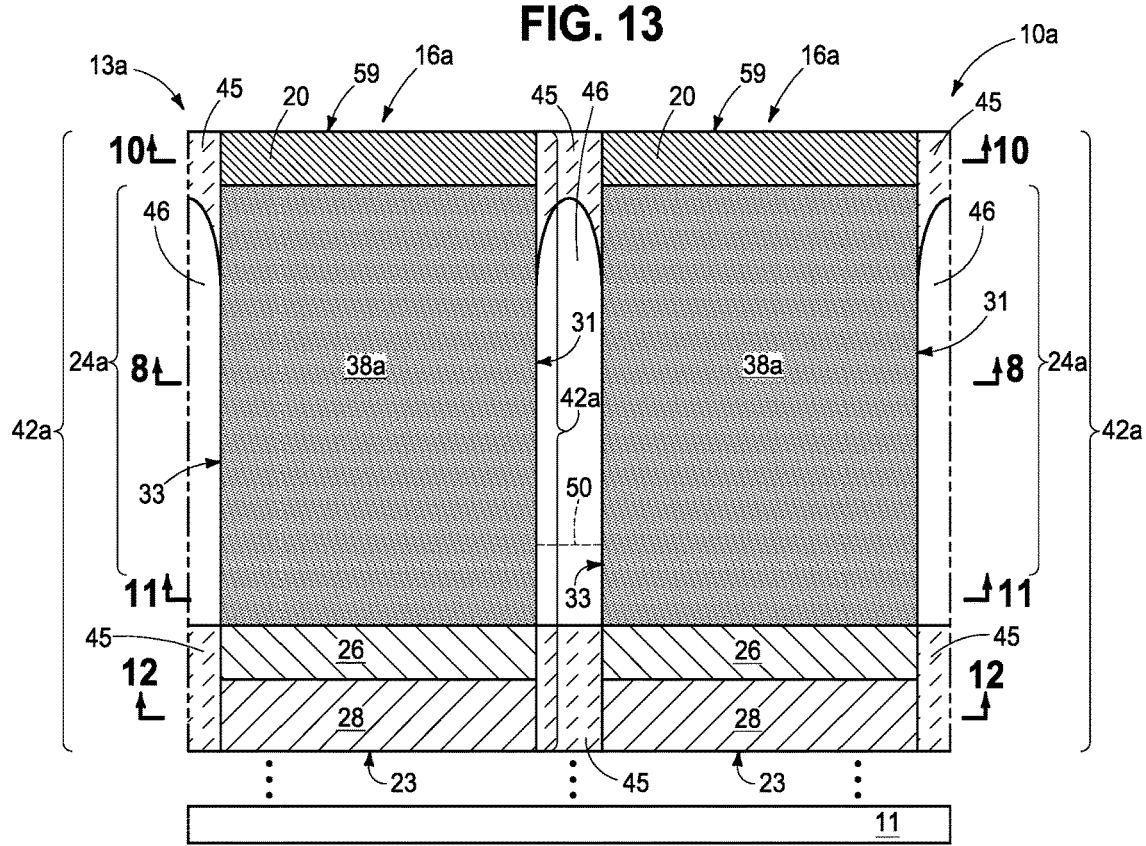
FIG. 14 is a cross-sectional view taken through line 14-14 in FIGS. 8 and 9.
Figure 15:
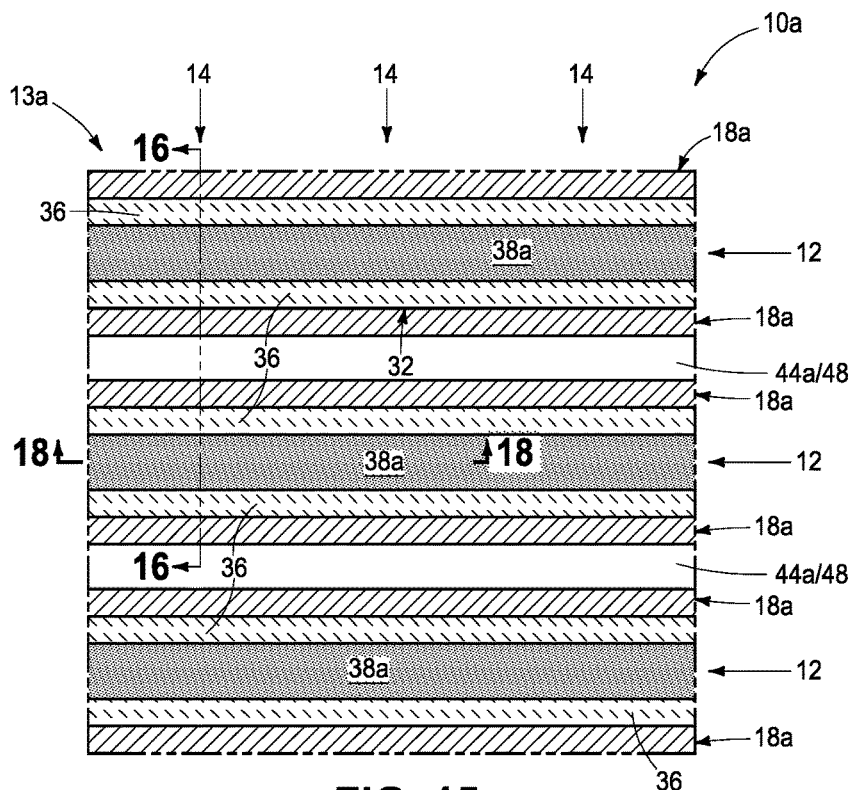
FIG. 15 is a diagrammatic cross-sectional view of a predecessor substrate to that shown by FIG. 8, and includes a portion taken through line 15-15 in FIGS. 16 and 18.
Figure 16:
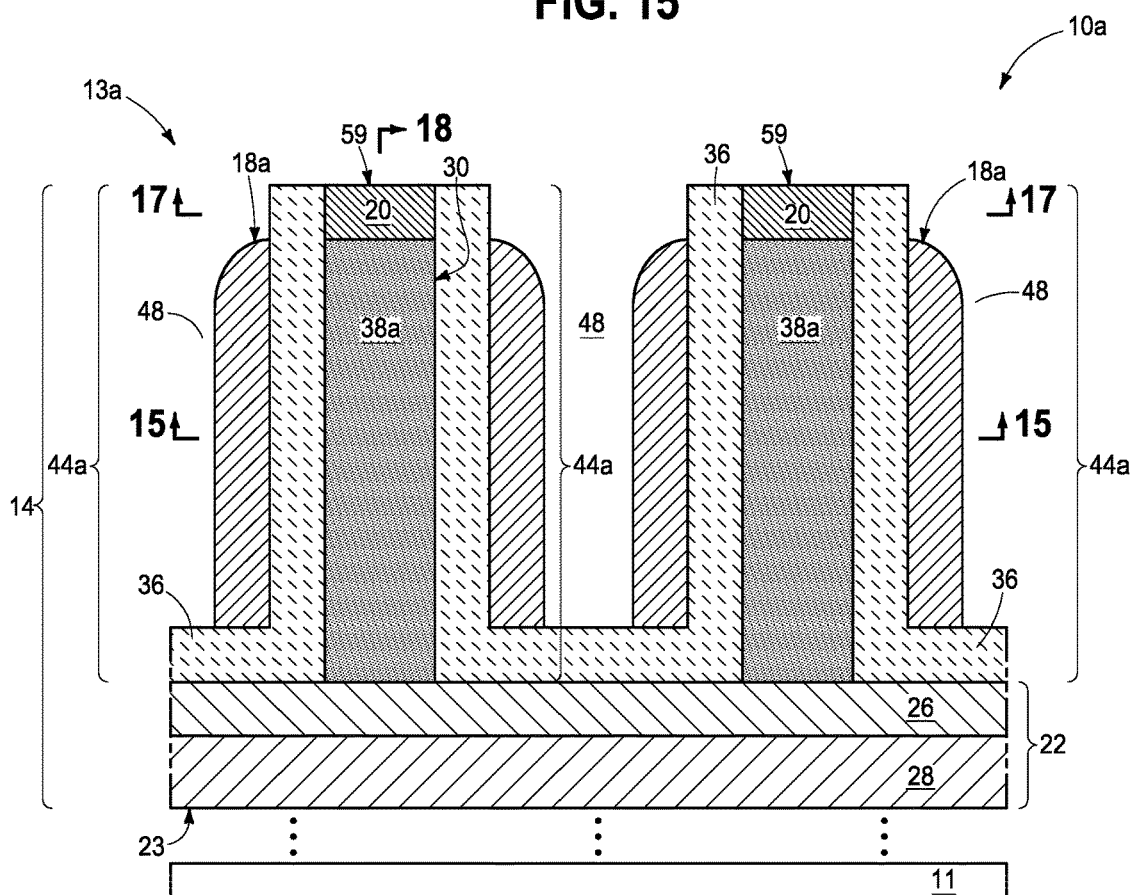
FIG. 16 is an enlarged cross-sectional view taken through line 16-16 in FIGS. 15 and 17.
Figure 17:
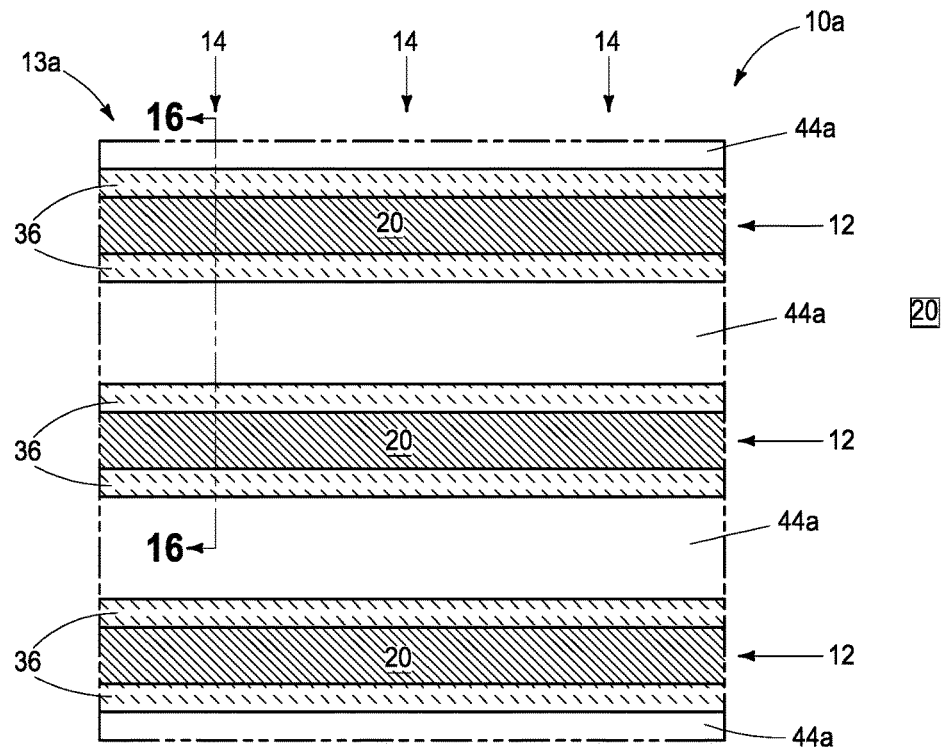
FIG. 17 is cross-sectional view including a portion taken through line 17-17 in FIGS. 16 and 18.
Figure 18:
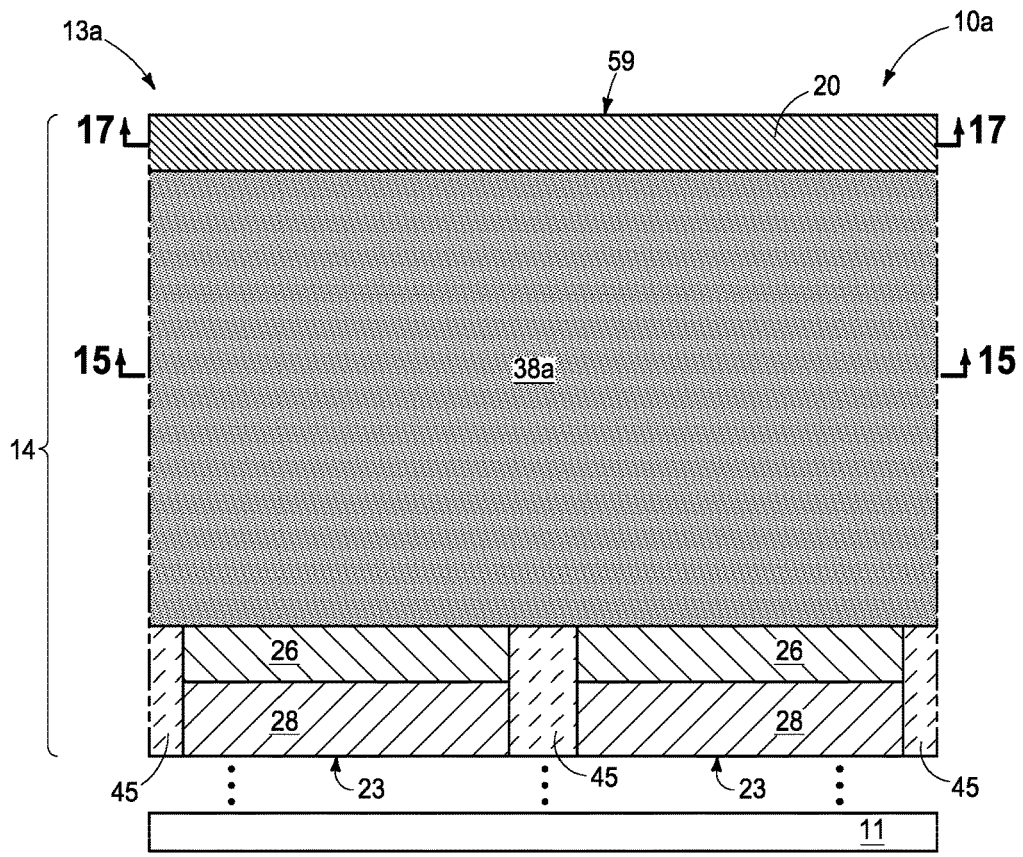
FIG. 18 is a cross-sectional view taken through line 18-18 in FIG. 16.
Figure 19:
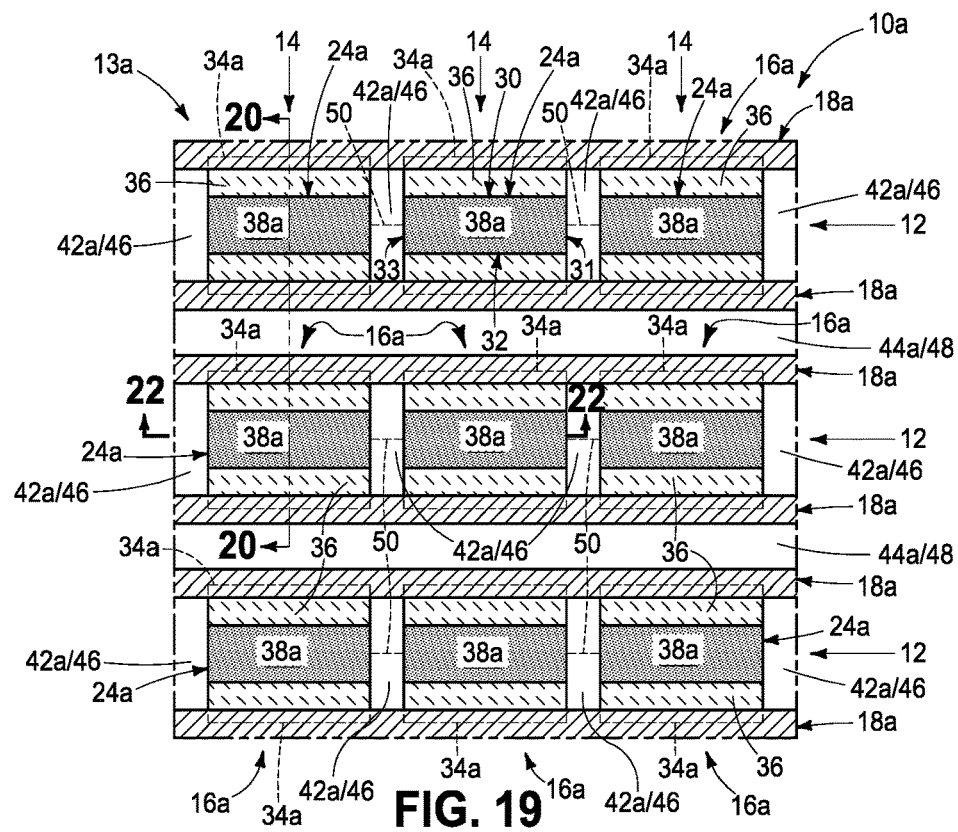
FIG. 19 is a view of the FIG. 15 substrate at a processing step subsequent to that shown by FIG. 15, and includes a portion taken through line 19-19 in FIGS. 20 and 22.
Figure 20:
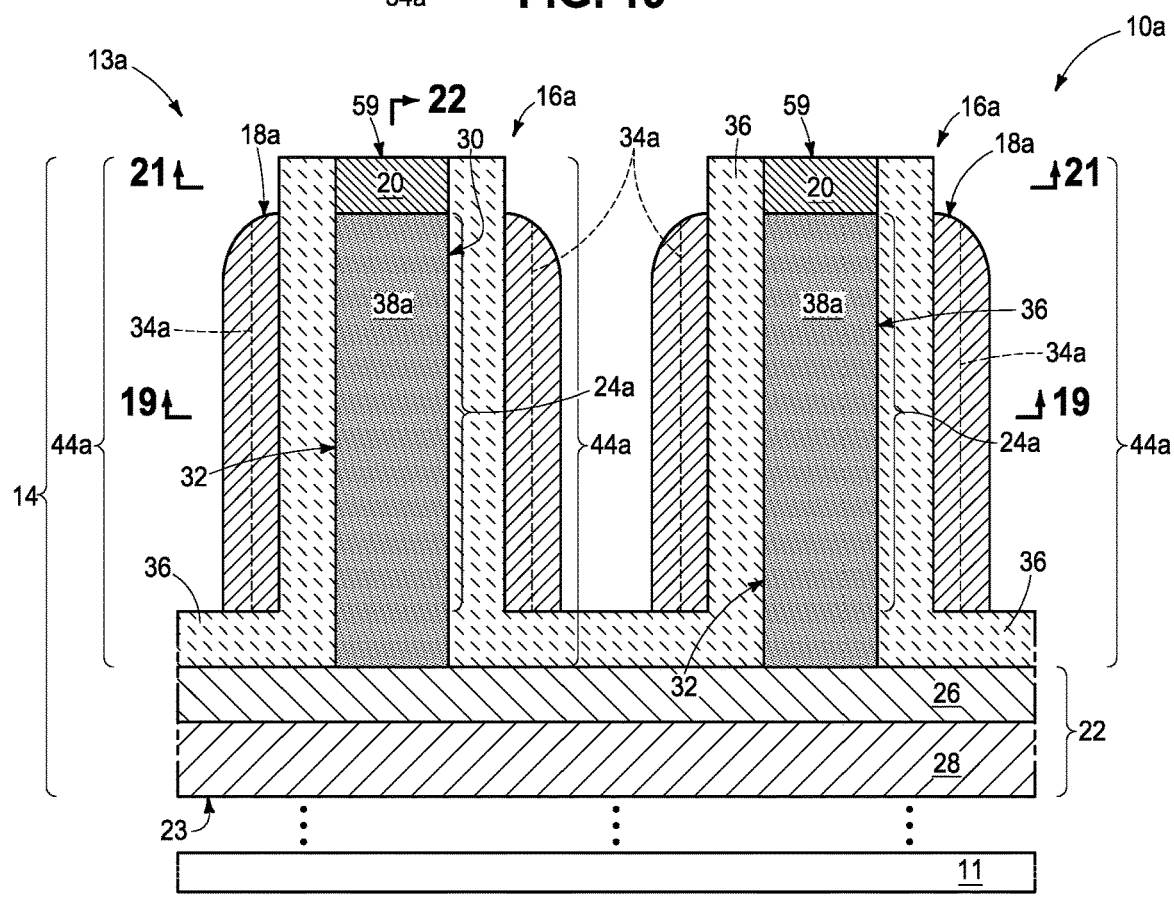
FIG. 20 is an enlarged cross-sectional view taken through line 20-20 in FIGS. 19 and 21.
Figure 21:
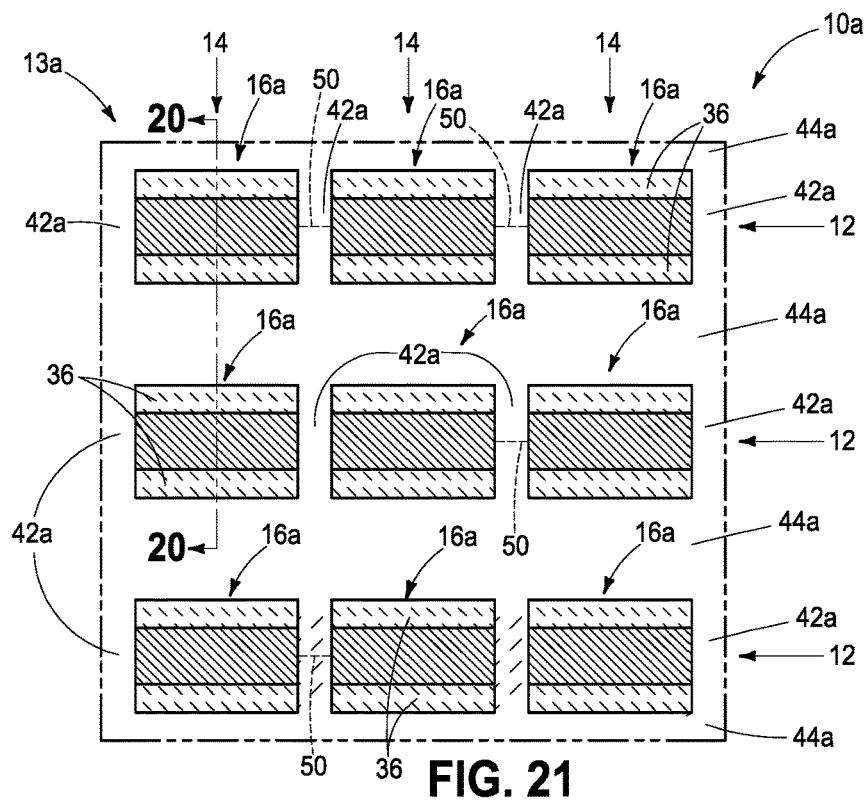
FIG. 21 is a cross-sectional view including a portion taken through line 21-21 in FIGS. 20 and 22.
Figure 22:
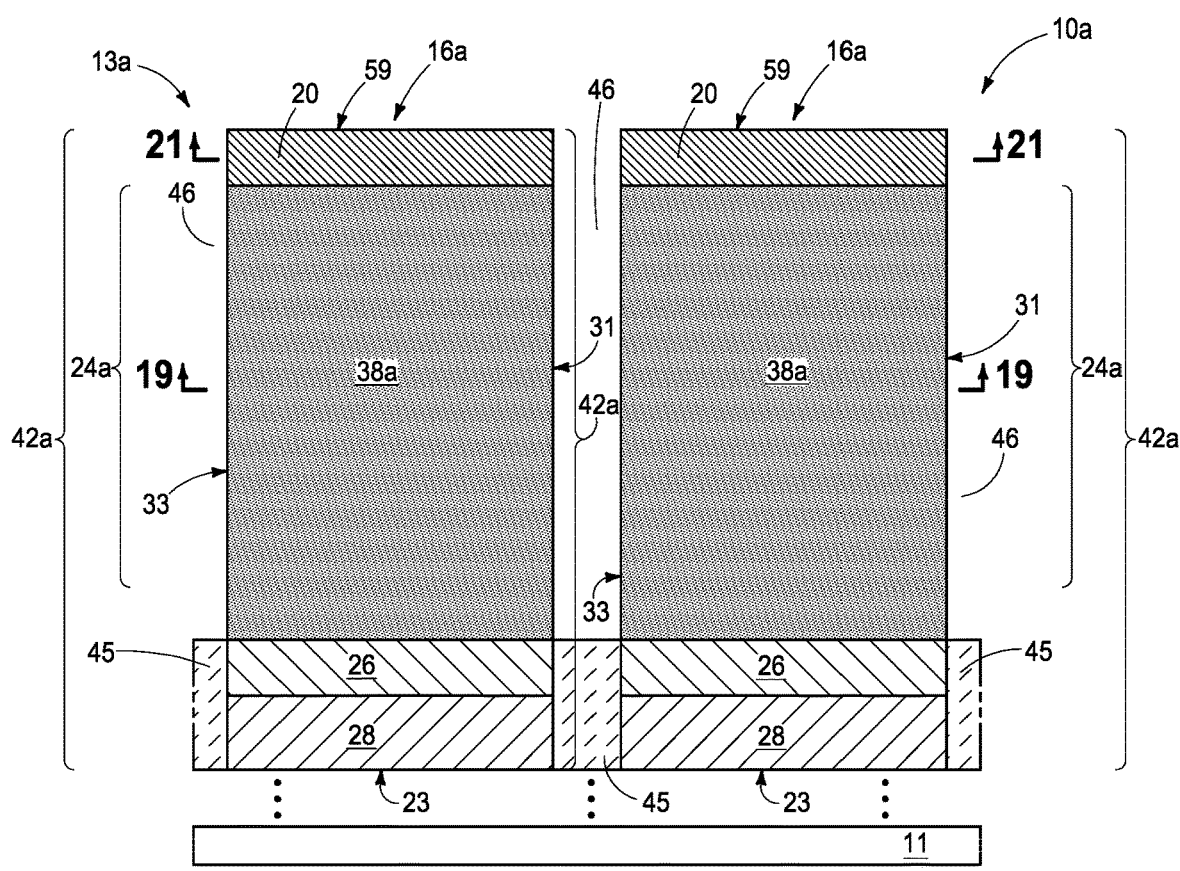
FIG. 22 is a cross-sectional view taken through line 22-22 in FIGS. 19 and 20.
Figure 23:
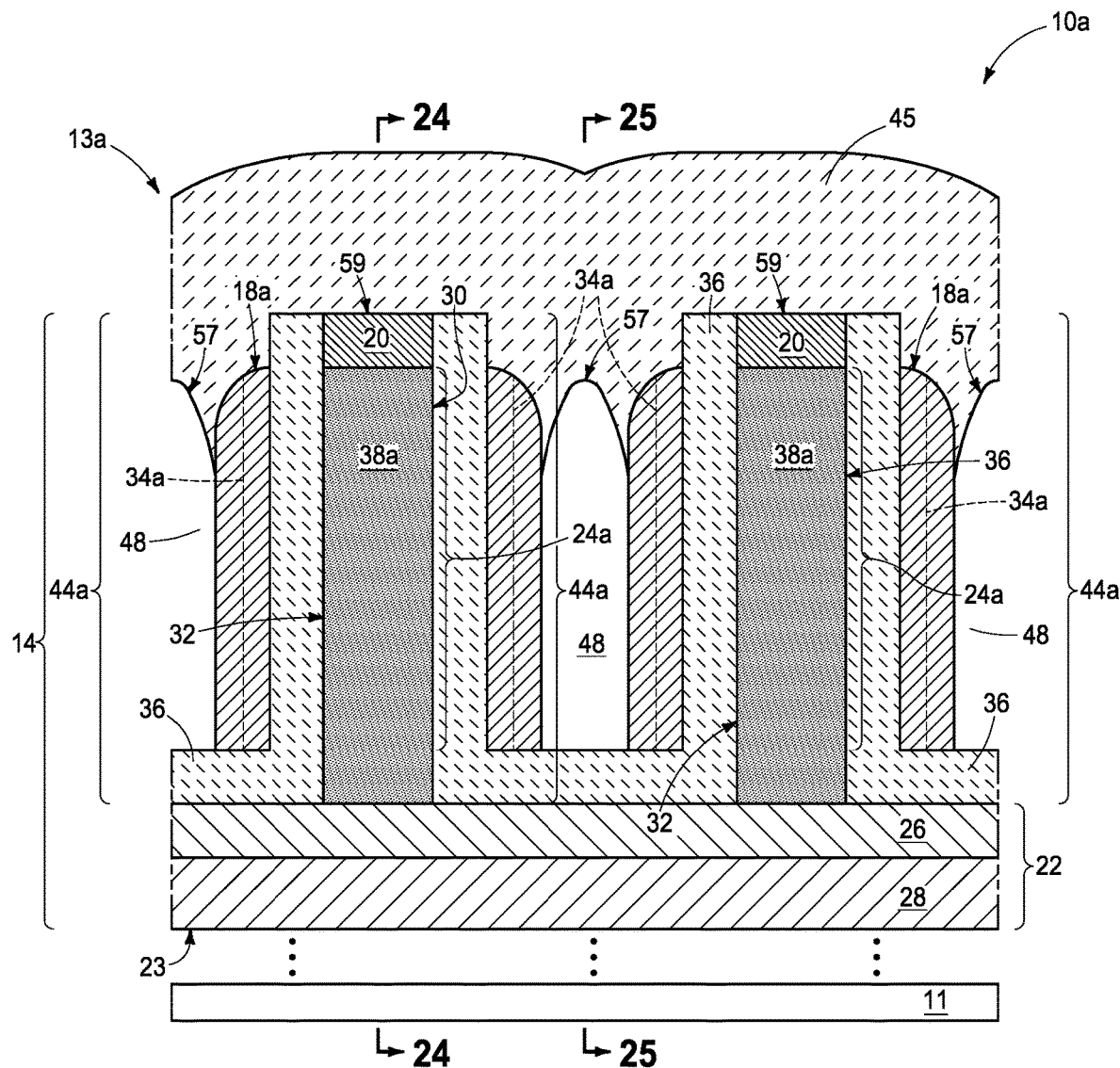
FIG. 23 is a view of the FIG. 20 substrate at a processing step subsequent to that shown by FIG. 20.
Figure 24:
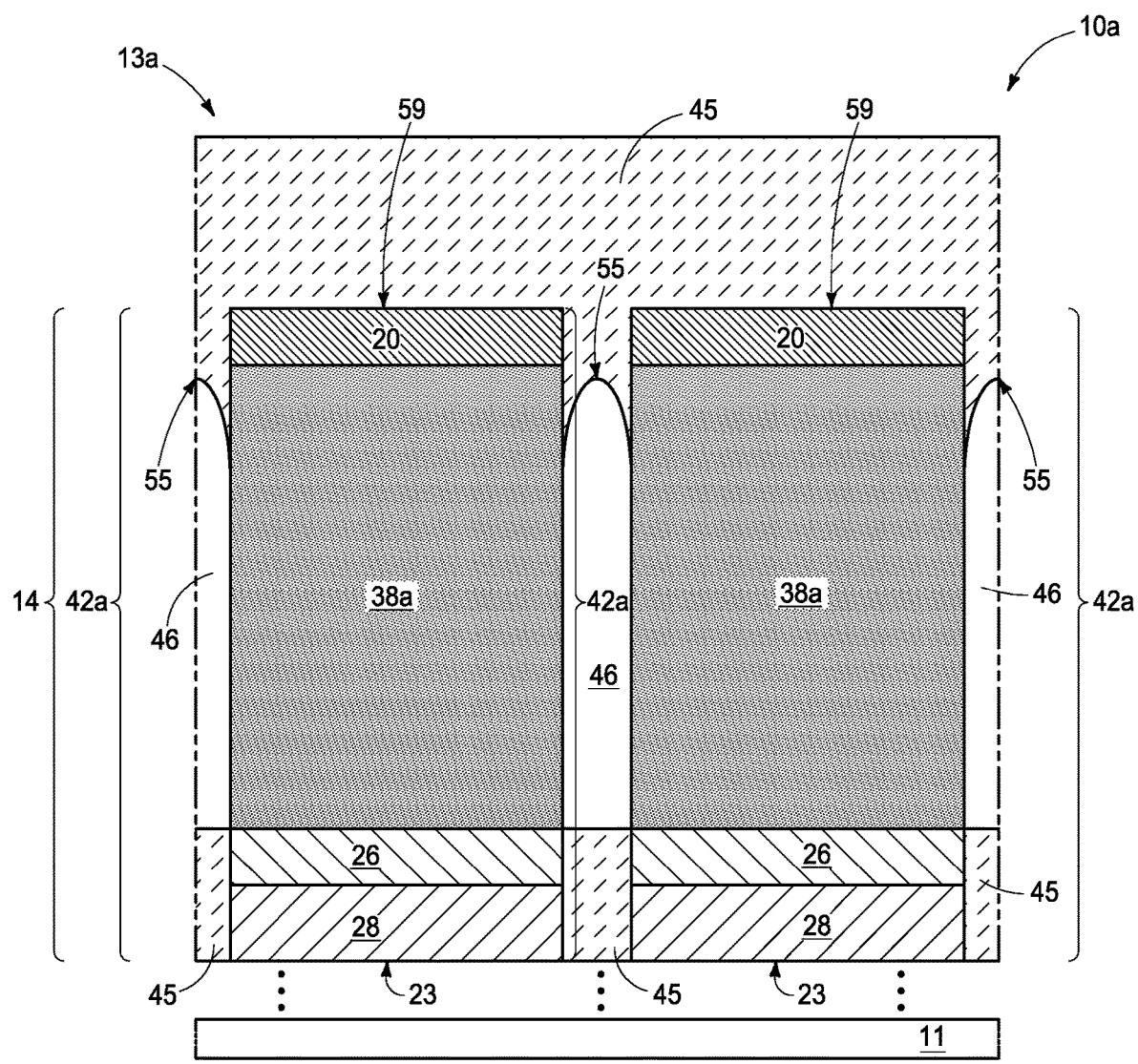
FIG. 24 is cross-sectional view taken through line 24-24 in FIG. 23.
Figure 25:
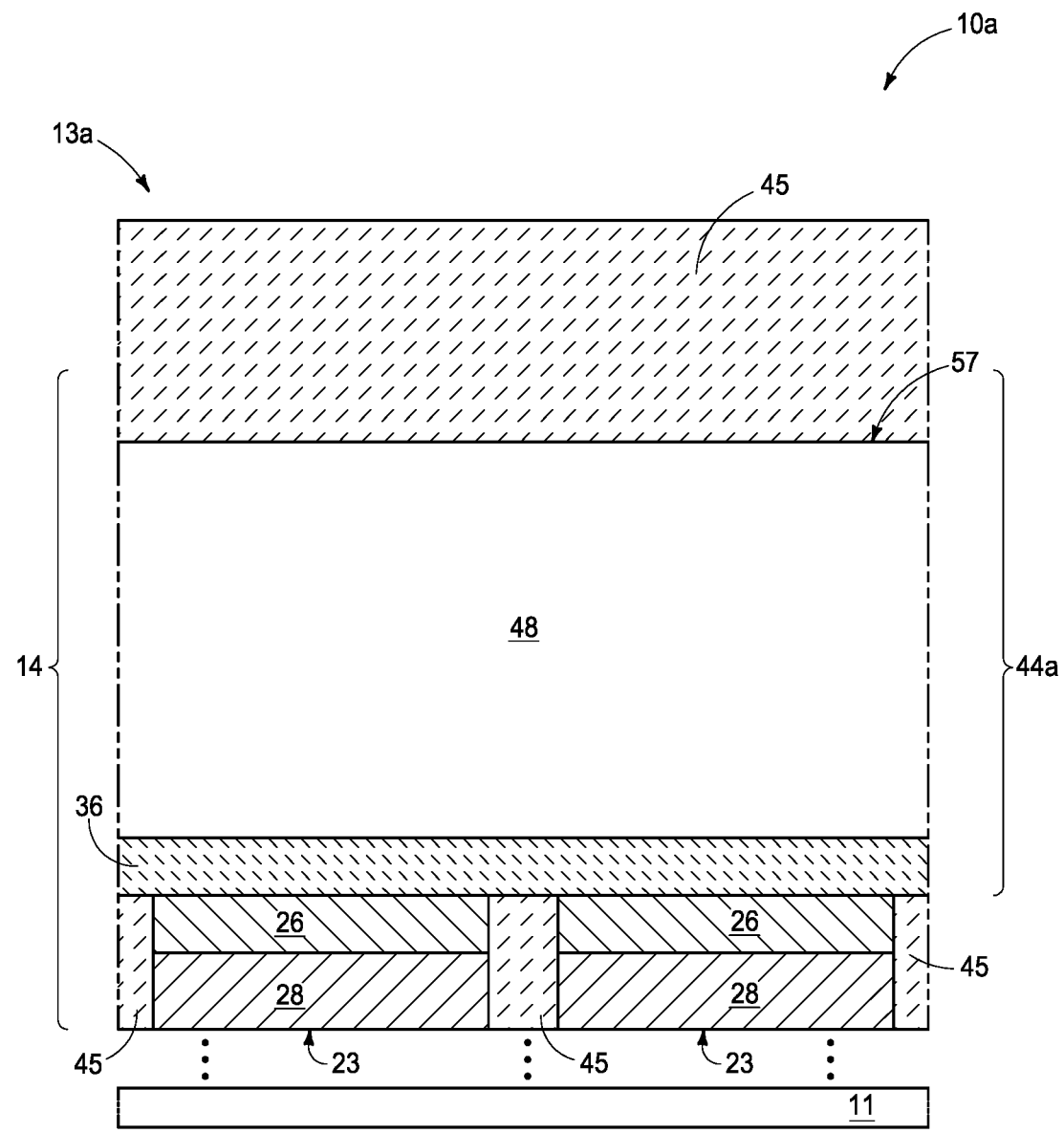
FIG. 25 is cross-sectional view taken through line 25-25 in FIG. 23.

Referring to FIGS. 23-25, insulator material 45 has been formed to bridge across (e.g., define) tops 55 of intra-row void space 46 and to bridge across (e.g., define) tops 57 of inter-row void space 48, thereby leaving intra-row void space 46 and inter-row void space 48 there-below. In one embodiment, insulator material 45 may subsequently be elevationally-removed back at least to tops 59 of upper source/drain regions 20, for example as shown in FIGS. 8 and 14. In one such embodiment and as shown, the act of removing forms insulator material 45 and upper source/drain regions 20 to have respective elevationally-outermost surfaces that are planar and coplanar.

Any other attribute(s) or aspect(s) as shown and/or described herein with respect to other embodiments may be used in the method embodiments.

Figure 26:
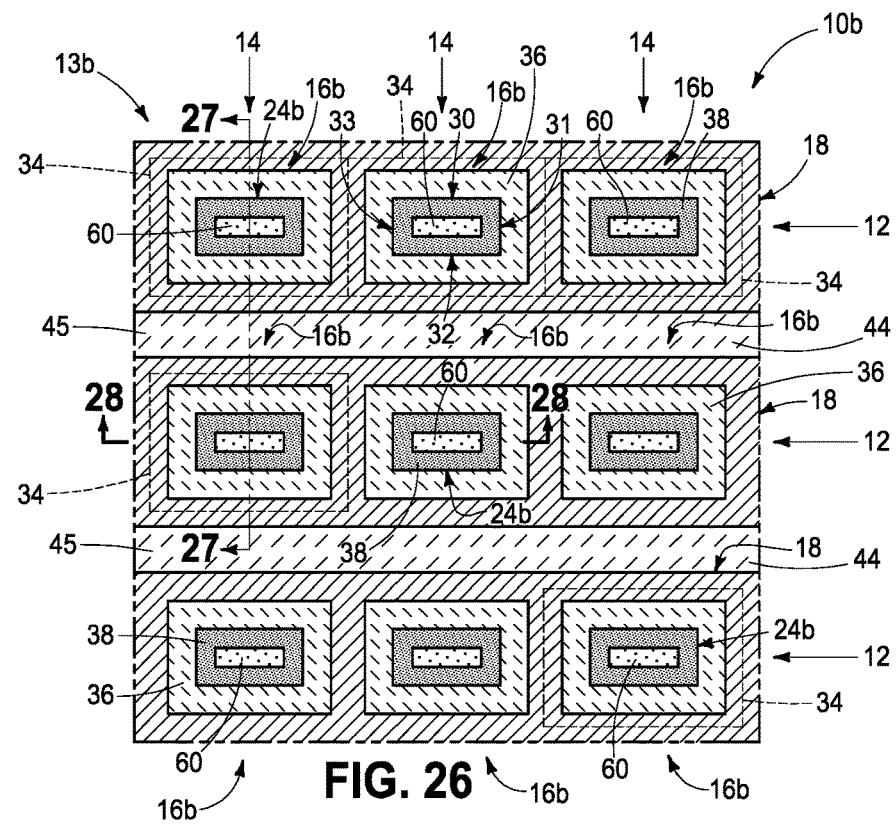
FIG. 26 is a diagrammatic cross-sectional view of a portion of a device comprising an array in accordance with an embodiment of the invention, and includes a portion taken through line 26-26 in FIGS. 27 and 28.
Figure 27:
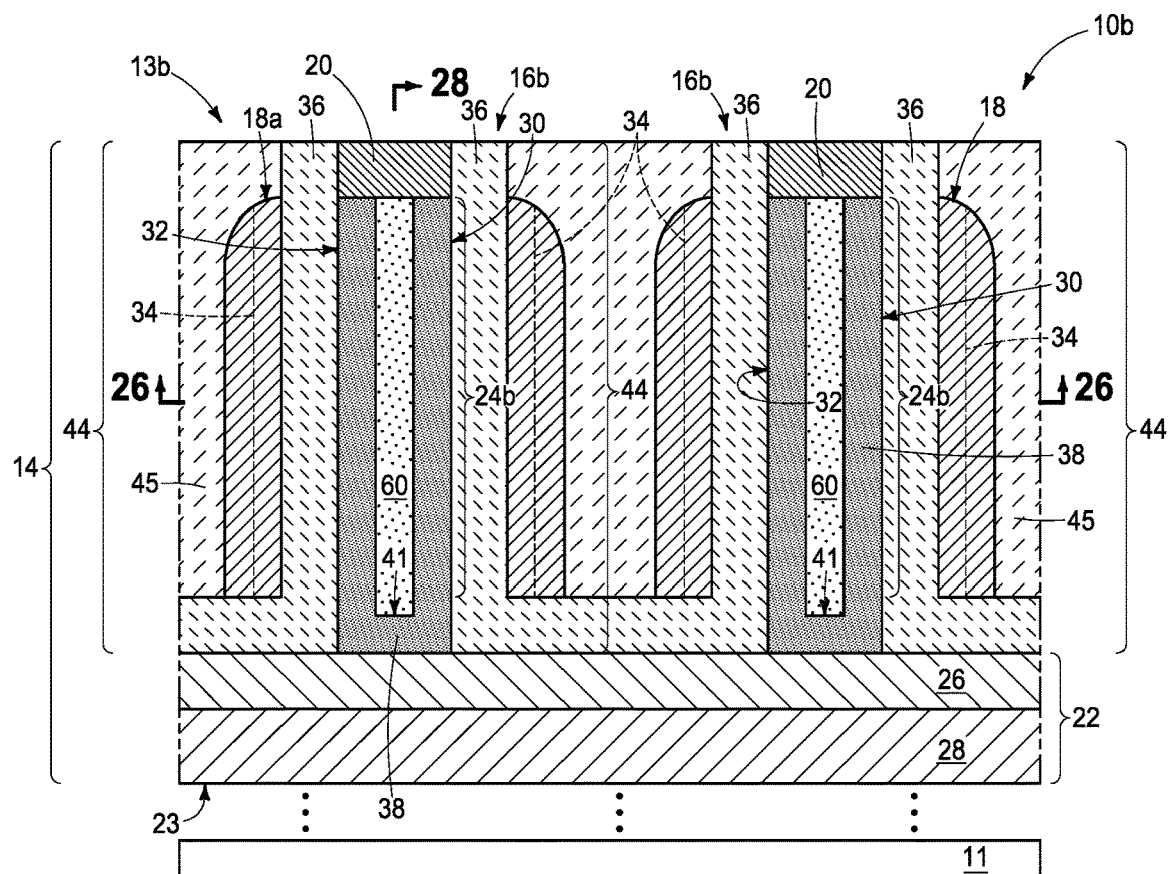
FIG. 27 is an enlarged cross-sectional view taken through line 27-27 in FIG. 26.
Figure 28:
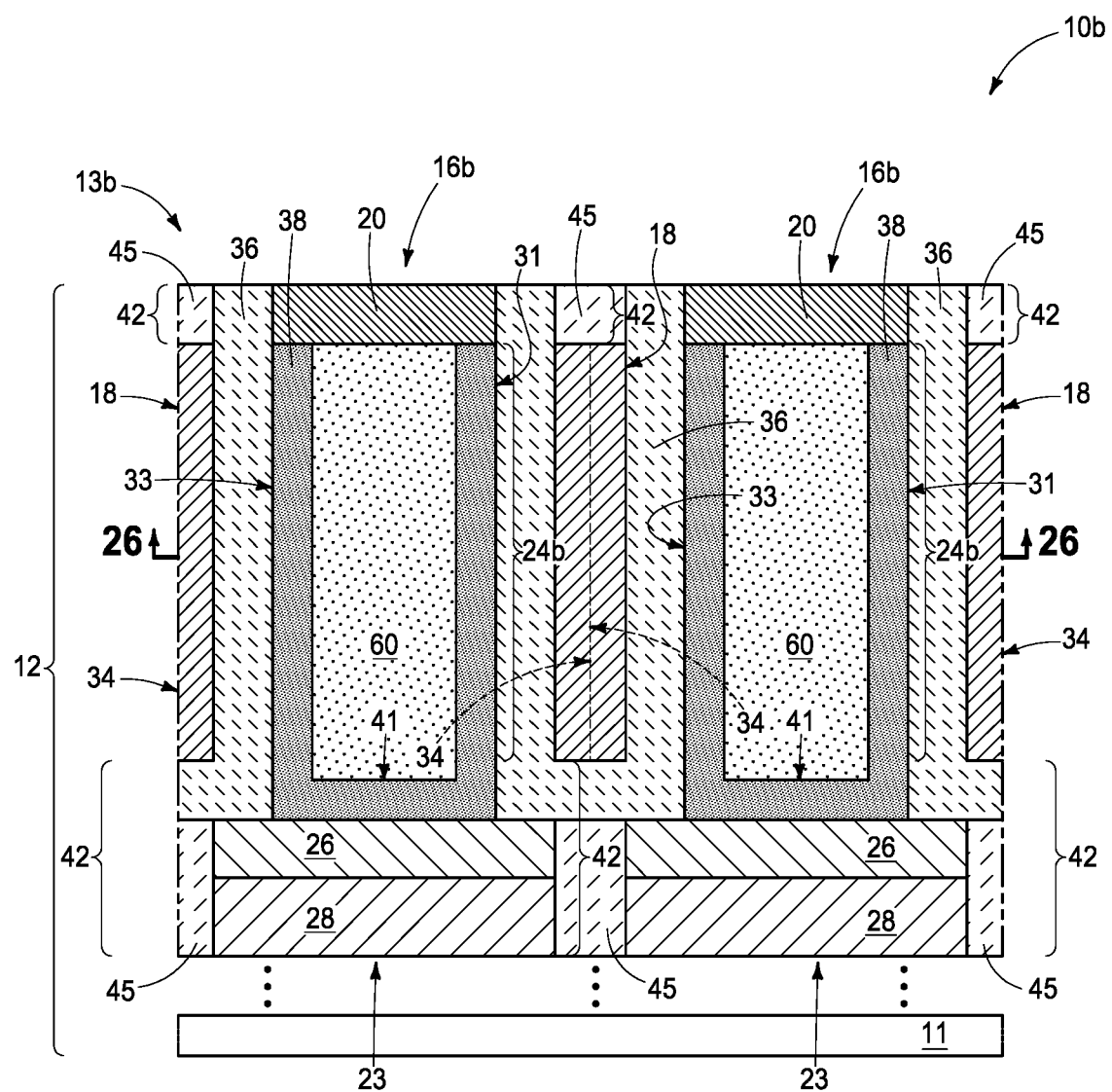
FIG. 28 is a cross-sectional view taken through line 28-28 in FIGS. 26 and 27.
Figure 29:
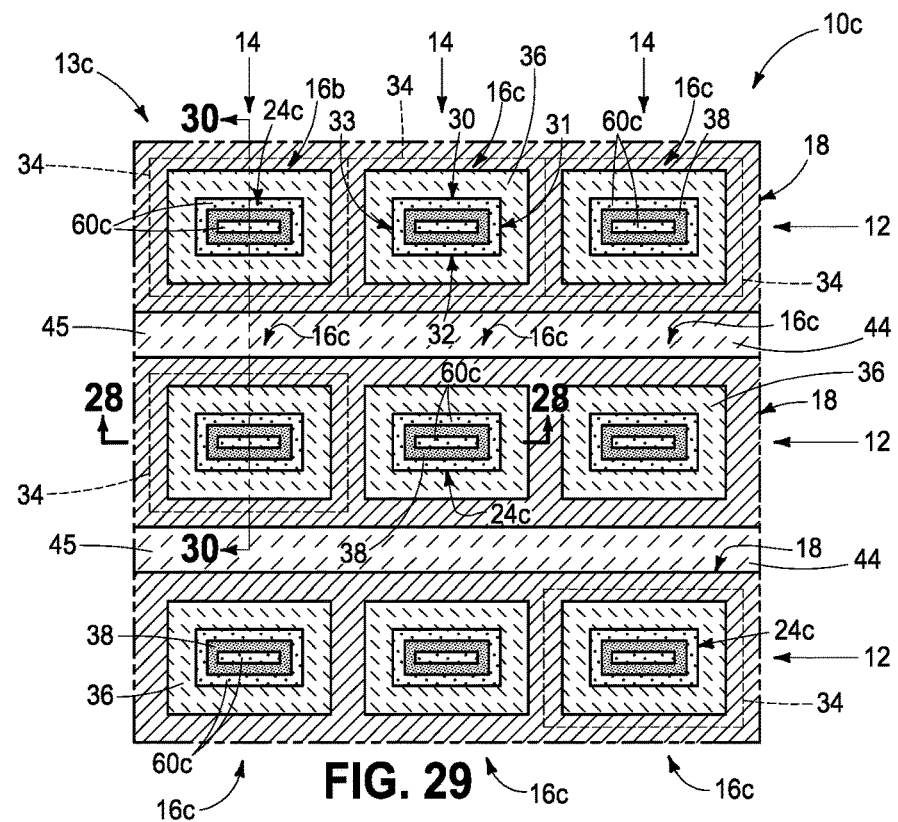
FIG. 29 is a diagrammatic cross-sectional view of a portion of a device comprising an array in accordance with an embodiment of the invention, and includes a portion taken through line 29-29 in FIG. 30.
Figure 30:
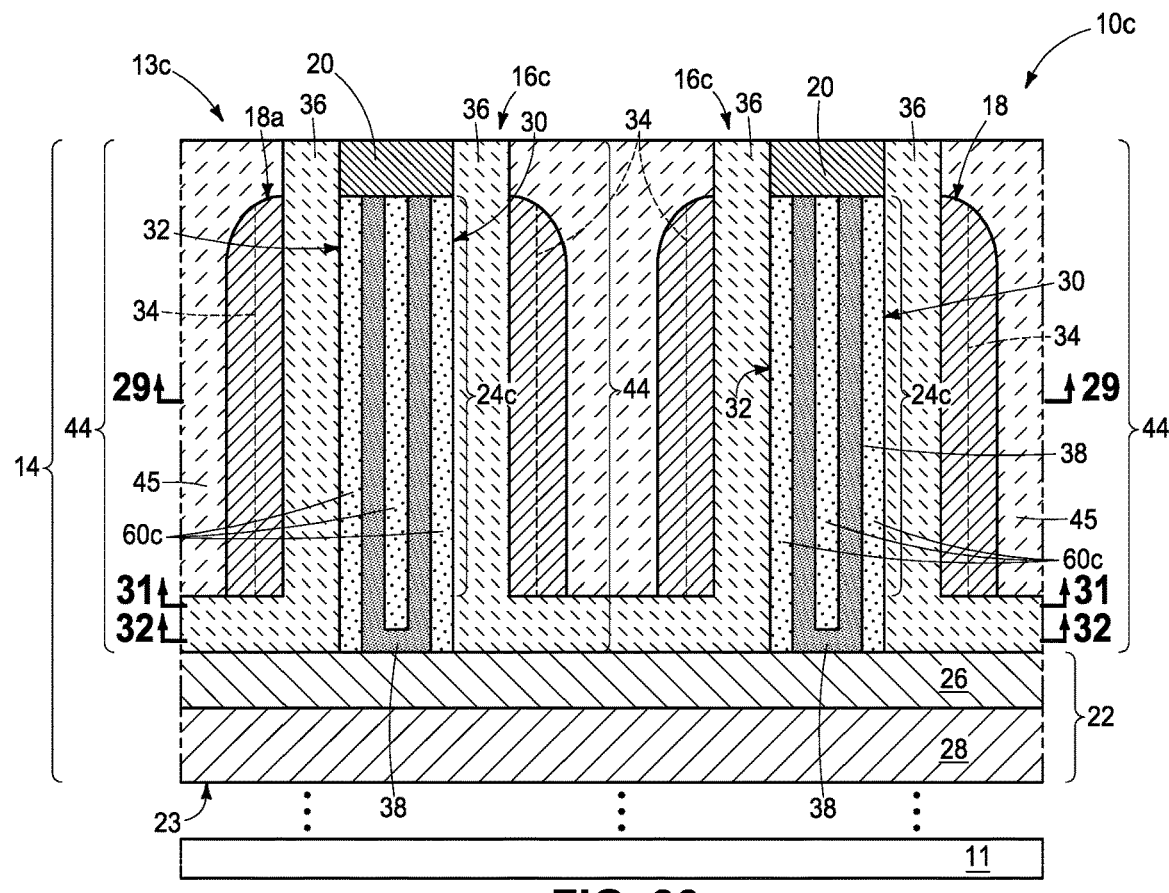
FIG. 30 is an enlarged cross-sectional view taken through line 30-30 in FIGS. 29, 31, and 32.
Figure 31:
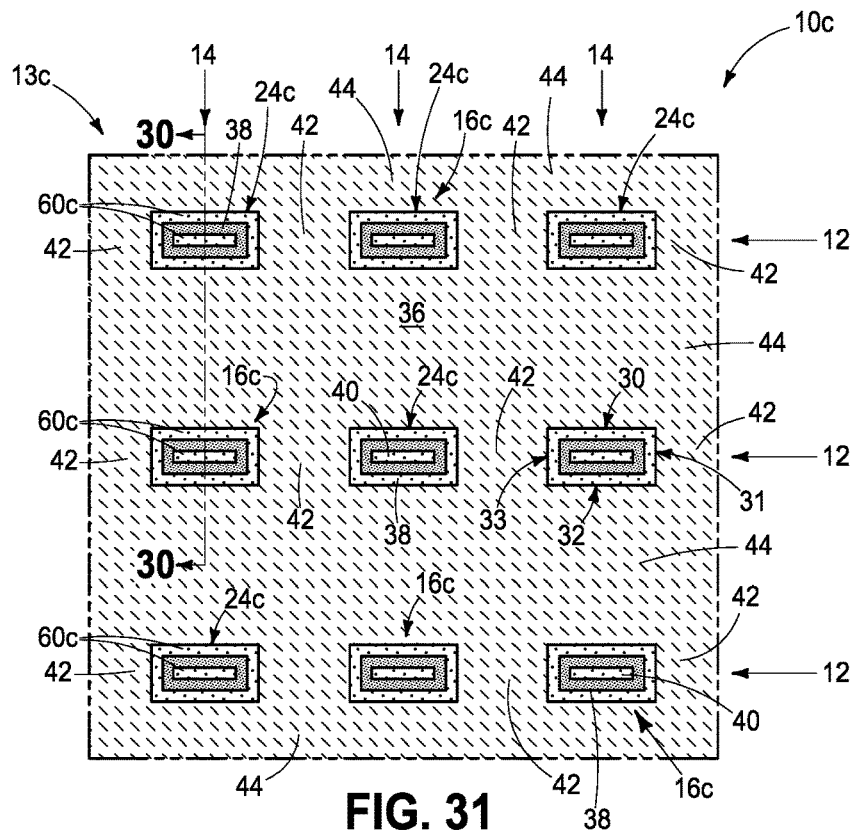
FIG. 31 is a cross-sectional view including a portion taken through line 31-31 in FIG. 30.
Figure 32:
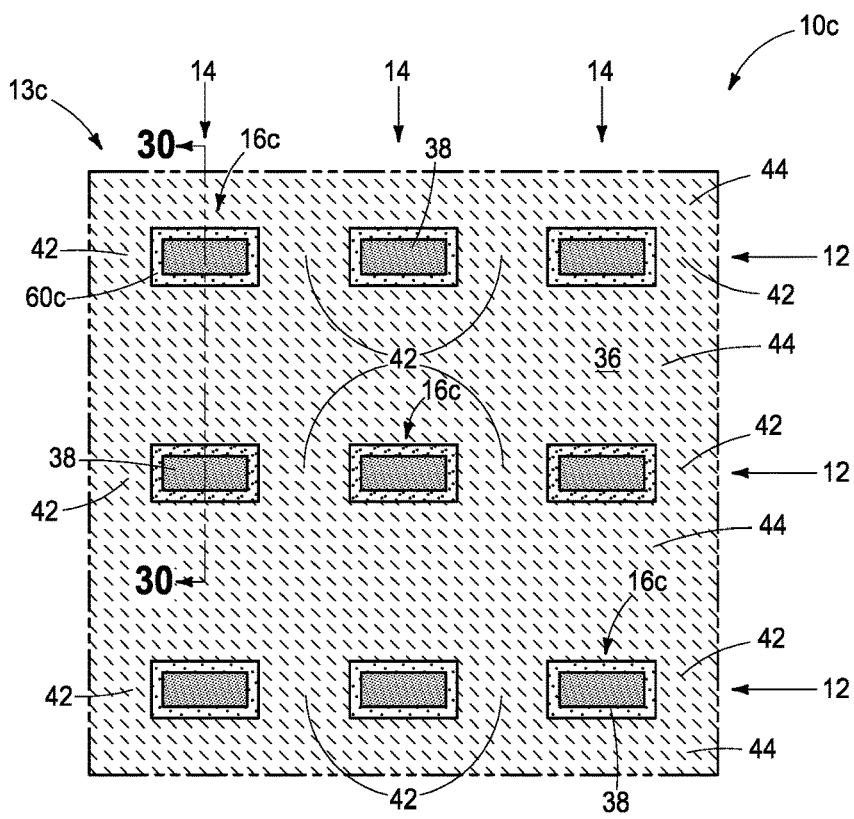
FIG. 32 is a cross-sectional view including a portion taken through line 32-32 in FIG. 30.

Another example embodiment device 10*b* in accordance with the invention is next described with reference to FIGS. 26-28. Like numerals from the above-described embodiments have been used where appropriate, with some construction differences being indicated with the suffix "b" or with different numerals. Such comprises an array 13*b* comprising rows 12 and columns 14 of elevationally-extending transistors 16*b*. An access line 18 interconnects multiple elevationally-extending transistors 16*b* along individual rows 12. Transistors 16*b* individually comprise an upper source/drain region 20, a lower source/drain region 22, and a channel region 24*b* extending elevationally there-between. Channel region 24*b* comprises an elevationally-elongated first material 38 comprising an oxide semiconductor. A transistor gate 34 is over two opposing sides (e.g., sides 30, 32 and/or sides 31, 33) of channel region 24*b*. A gate insulator 36 is over the individual two opposing sides of channel region 24*b* laterally between channel region 24*b* and transistor gate 34. In one embodiment and as shown, transistor gate 34 comprises a portion of individual access lines 18.

An elevationally-elongated second material 60 is aside channel-region-first material 38. Second material 60 has greater $E_g$ ($E_g$ being electronic band gap) than first material 38. Second material 60 may be an oxide semiconductor. For example, if first material 38 consists essentially of or consists of $In_xGa_yZn_zO_a$ ($E_g$=3.2 eV and commonly referred to as of IGZO), example oxide semiconductors (e.g., metal oxides) for second material 60 include $In_2O_3$ ($E_g$=3.6 eV), $Ga_2O_3$ ($E_g$=4.8 eV), ZnO ($E_g$=3.4 eV), $InZnO_z$ ($E_g$=3.5 eV), $InGaO_z$($E_g$=3.5 eV), and $InZnO_z$ ($E_g$=3.5 eV). Additional example second materials 60 include a metal oxide doped with at least one of C, Si, Ge, and Sn, and metal nitrides (e.g., AlN [$E_g$=6 eV], GaN [$E_g$=3.4 eV]). Second material 60 may comprise, consist essentially of, or consist of one or more metal oxides and/or one or more metal nitrides individually having greater $E_g$ than first material 38. Alternately, some of second material 60 may comprise material having equal and/or lower $E_g$ than that of first material 38 as long as thickness of material 60 overall has Eg greater than that of first material 38.

In one embodiment, the oxide semiconductor of first material 38 and second material 60 are directly against one another. In one embodiment, the oxide semiconductor of first material 38 is directly against both of upper source/drain region 20 and lower source/drain region 22. In one embodiment, second material 60 is directly against only one of the upper or lower source/drain regions, with such being shown in the example embodiment as being directly against only upper source/drain region 20. In one embodiment, gate insulator 36 is ferroelectric and device 10 comprises memory. In one embodiment, $E_g$ of second material 60 is no more than 7 eV greater than the $E_g$ of first material 38, and in one embodiment the $E_g$ of second material 60 is no more than 8.5 eV.

Any other attribute(s) or aspect(s) as shown and/or described herein with respect to other embodiments may be used.

Device 10*b* shows one example wherein the oxide semiconductor of first material 38 is directly against gate insulator 36, and one such embodiment wherein second material 60 is not directly against gate insulator 36. An alternate example embodiment device 10*c* comprising an elevationally-extending transistor 16*c* is next described with reference to FIGS. 29-32. Like numerals from the above-described embodiments have been used where appropriate, with some construction differences being indicated with the suffix "c". Transistor 16*c* of device 10*c* has second material 60*c* directly against gate insulator 36, and in one such embodiment shows an example wherein oxide semiconductor of first material 38 is not directly against gate insulator 36. More layers of first material 38 and second material 60*c* may be used (not shown). Any other attribute(s) or aspect(s) as shown and/or described herein with respect to other embodiments may be used.

In some embodiments, any one or more of the elevationally-extending features is formed to be vertical or within 10° of vertical.

The devices discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extending elevationally" refer to a direction that is angled away by at least 45° from exactly horizontal. Further, "extend(ing) elevationally" and "elevationally-extending" with respect to a field effect transistor are with reference to orientation of the transistor's channel length along which current flows in operation between the source/drain regions. For bipolar junction transistors, "extend(ing) elevationally" and "elevationally-extending" are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

Use of "row" and "column" in this document is for convenience in distinguishing one series or orientation of features from another series or orientation of features and along which components have been or will be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles.

CONCLUSION

In some embodiments, a device comprises an array comprising rows and columns of elevationally-extending transistors. An access line interconnects multiple of the elevationally-extending transistors along individual of the rows. The transistors individually comprise an upper source/drain region, a lower source/drain region, and a channel region extending elevationally there-between. The channel region comprises an oxide semiconductor. A transistor gate is operatively laterally-proximate the channel region and comprises a portion of an individual of the access lines. Intra-row-insulating material is longitudinally between immediately-intra-row-adjacent of the elevationally-extending transistors. Inter-row-insulating material is laterally between immediately-adjacent of the rows of the elevationally-extending transistors. At least one of the intra-row-insulating material and the inter-row-insulating material comprises void space.

In some embodiments, an elevationally-extending transistor comprises an upper source/drain region, a lower source/drain region, and a channel region extending elevationally there-between. A transistor gate is over two opposing sides of the channel region. A gate insulator is over individual of the two opposing sides of the channel region laterally between the channel region and the transistor gate. The two opposing sides of the channel region individually comprise an oxide semiconductor. An elevationally-elongated void space is laterally between the two opposing sides of the channel region. The oxide semiconductor extending laterally across a bottom of the void space.

In some embodiments, a device comprises an array comprising rows and columns of elevationally-extending transistors. An access line interconnects multiple of the elevationally-extending transistors along individual of the rows. The transistors individually comprise an upper source/drain region, a lower source/drain region, and a channel region extending elevationally there-between. A transistor gate is over two opposing sides of the channel region. A gate insulator is over individual of the two opposing sides of the channel region laterally between the channel region and the transistor gate. The transistor gate comprises a portion of an individual of the access lines. The two opposing sides of the channel region individually comprise an oxide semiconductor. An elevationally-elongated void space is laterally between the two opposing sides of the channel region.

In some embodiments, an elevationally-extending transistor comprises an upper source/drain region, a lower source/drain region, and a channel region extending elevationally there-between. The channel region comprises an elevationally-elongated first material comprising an oxide semiconductor. A transistor gate is over two opposing sides of the channel region. A gate insulator is over individual of the two opposing sides of the channel region laterally between the channel region and the transistor gate. An elevationally-elongated second material is aside the channel-region-first material. The second material has greater $E_g$ than the first material.

In some embodiments, a device comprises an array comprising rows and columns of elevationally-extending transistors. An access line interconnects multiple of the elevationally-extending transistors along individual of the rows. The transistors individually comprise an upper source/drain region, a lower source/drain region, and a channel region extending elevationally there-between. The channel region comprises an elevationally-elongated first material comprising an oxide semiconductor. A transistor gate is over two opposing sides of the channel region. A gate insulator is over individual of the two opposing sides of the channel region laterally between the channel region and the transistor gate. The transistor gate comprises a portion of an individual of the access lines. An elevationally-elongated second material is aside the channel-region-first material. The second material has greater $E_g$ than the first material.

In some embodiments, a method of forming a device comprises forming an array comprising rows and columns of elevationally-extending transistors, with an access line interconnecting multiple of the elevationally-extending transistors along individual of the rows. The transistors individually comprise an upper source/drain region, a lower source/drain region, and a channel region extending elevationally there-between. The channel region comprises an oxide semiconductor. A transistor gate is operatively laterally proximate the channel region and comprises a portion of an individual of the access lines. Intra-row void space is longitudinally between immediately-intra-row-adjacent of the elevationally-extending transistors. Inter-row void space is laterally between immediately-adjacent of the rows of the elevationally-extending transistors. Insulator material is formed to bridge across tops of the intra-row void space and to bridge across tops of the inter-row void space and leave the intra-row void space and the inter-row void space there-below.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a device, comprising:
    forming an array comprising rows and columns of elevationally-extending transistors, an access line interconnecting multiple of the elevationally-extending transistors along individual of the rows;
    the transistors individually comprising:
        an upper source/drain region, a lower source/drain region, and a channel region extending elevationally there-between; the channel region comprising an oxide semiconductor; and
        a transistor gate operatively laterally proximate the channel region, the transistor gate comprising a portion of an individual of the access lines;
    intra-row void space being longitudinally between immediately-intra-row-adjacent of the elevationally-extending transistors;
    inter-row void space laterally between immediately-adjacent of the rows of the elevationally-extending transistors; and
    forming insulator material to bridge across tops of the intra-row void space and to bridge across tops of the inter-row void space and leave the intra-row void space and the inter-row void space there-below.

2. The method of claim 1 wherein forming the insulator material comprises:
    depositing the insulator material to cover the intra-row void space and the inter-row void space; and
    after the depositing, removing the insulator material back elevationally at least to tops of the upper source/drain regions.

3. The method of claim 2 wherein the removing forms the insulator material and the upper source/drain regions to have respective elevationally-outermost surfaces that are planar and coplanar.

4. The method of claim 1 wherein forming the elevationally-extending transistors comprises:
    forming the oxide-semiconductor-channel-comprising material, the gate insulator material, the access lines, the lower source/drains, and the upper source/drain regions running continuously in lines along the individual rows; and
    intra-row patterning the lines of oxide-semiconductor-channel-comprising material and lines of the upper source/drain regions to form the channel regions and the upper source/drain regions of the individual transistors.

5. A device comprising:
    an array comprising rows and columns of elevationally-extending transistors;
    an access line interconnecting multiple of the elevationally-extending transistors along individual of the rows;
    the transistors individually comprising:
        an upper source/drain region, a lower source/drain region, and a channel region extending elevationally there-between; the channel region comprising an oxide semiconductor; and
        a transistor gate operatively laterally-proximate the channel region, the transistor gate comprising a portion of an individual of the access lines;
    intra-row-insulating material longitudinally between immediately-intra-row-adjacent of the elevationally-extending transistors;
    inter-row-insulating material laterally between immediately-adjacent of the rows of the elevationally-extending transistors; and
    at least one of the intra-row-insulating material and the inter-row-insulating material comprising void space.

6. The device of claim 5 wherein the intra-row-insulating material comprises intra-row void space.

7. The device of claim 6 wherein the immediately-intra-row-adjacent transistors have a respective maximum intra-row-separation-distance longitudinally between closest-operative-transistor material, the intra-row void space individually extending longitudinally along at least 50% of said respective maximum intra-row-separation-distance.

8. The device of claim 7 wherein the intra-row void space individually extends longitudinally along at least 75% of said respective maximum intra-row-separation-distance.

9. The device of claim 5 wherein the inter-row-insulating material comprises inter-row void space.

10. The device of claim 5 wherein the intra-row-insulating material comprises intra-row void space and the inter-row-insulating material comprises inter-row void space.

11. The device of claim 10 wherein the intra-row void space and the inter-row void space collectively do not completely surround the channel region of individual of the transistors.

12. The device of claim 5 wherein the transistor gate is over two opposing sides of the channel region.

13. The device of claim 12 wherein the transistor gate laterally surrounds the channel region.

14. The device of claim 12 wherein the transistors individually comprise:
  a gate insulator over individual of the two opposing sides of the channel region laterally between the channel region and the transistor gate, the two opposing sides of the channel region individually comprising the oxide semiconductor, an elevationally-elongated void space being laterally between the two opposing sides of the channel region.

15. The device of claim 5 wherein the transistors are elevationally-extending to be vertical or within 10° of vertical.

\* \* \* \* \*